United States Patent
Araki

(10) Patent No.: US 12,463,575 B2
(45) Date of Patent: Nov. 4, 2025

(54) SEMICONDUCTOR APPARATUS AND SEMICONDUCTOR CHIP

(71) Applicant: FUJI ELECTRIC CO., LTD., Kawasaki (JP)

(72) Inventor: Ryu Araki, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 222 days.

(21) Appl. No.: 17/976,053

(22) Filed: Oct. 28, 2022

(65) Prior Publication Data

US 2023/0188074 A1 Jun. 15, 2023

(30) Foreign Application Priority Data

Dec. 9, 2021 (JP) .................. 2021-200176

(51) Int. Cl.
*H02P 27/06* (2006.01)
*H01L 23/049* (2006.01)
*H01L 23/31* (2006.01)
*H01L 23/495* (2006.01)

(52) U.S. Cl.
CPC ............ *H02P 27/06* (2013.01); *H01L 23/049* (2013.01); *H01L 23/3107* (2013.01); *H01L 23/4952* (2013.01); *H01L 23/49568* (2013.01); *H01L 23/49575* (2013.01)

(58) Field of Classification Search
CPC . H01L 23/3107; H01L 23/49575; H02P 27/06
See application file for complete search history.

(56) References Cited

U.S. PATENT DOCUMENTS

| | | | |
|---|---|---|---|
| 5,576,941 A * | 11/1996 | Nguyen | H02J 9/062 363/133 |
| 7,215,189 B2 | 5/2007 | Wilhelm | |
| 7,436,031 B2 * | 10/2008 | Kitabatake | H10D 84/811 257/E27.012 |
| 10,043,872 B2 * | 8/2018 | Tanaka | H01L 29/0634 |

(Continued)

FOREIGN PATENT DOCUMENTS

| | | |
|---|---|---|
| JP | 2011-129628 A | 6/2011 |
| JP | 2014-90006 A | 5/2014 |
| JP | 2019-192833 A | 10/2019 |

*Primary Examiner* — Rina I Duda

(57) ABSTRACT

A semiconductor apparatus includes: a power semiconductor element; a control chip including a plurality of terminals including a first terminal and a second terminal, and being configured to control the power semiconductor element using a power supply voltage supplied to the second terminal; a first conductor for supplying a predetermined control voltage to the first terminal; a first line for supplying the power supply voltage to the second terminal; and semiconductor chip including a diode that is used for a bootstrap operation for generating the power supply voltage. The semiconductor chip includes: a semiconductor substrate: including a first face and a second face that are opposed to each other; and having a PN junction of the diode formed by a p-type semiconductor region on the first face and an n-type semiconductor region on the second face, an anode formed on the first face and joined to a surface of the first conductor, and a cathode formed on the second face and electrically connected to the second terminal via the first line.

18 Claims, 12 Drawing Sheets

(56) References Cited

U.S. PATENT DOCUMENTS

| | | |
|---|---|---|
| 2011/0140179 A1 | 6/2011 | Kusunoki et al. |
| 2016/0134280 A1* | 5/2016 | Simmonds ............ H02M 5/293 |
| | | 327/437 |
| 2017/0358522 A1* | 12/2017 | Nakamura ........ H01L 23/49568 |
| 2018/0061827 A1* | 3/2018 | Kanno .................... H01L 25/18 |
| 2018/0331647 A1* | 11/2018 | Matsuzaki ............ H02M 3/325 |
| 2019/0305689 A1* | 10/2019 | Ando .................... H02M 7/537 |
| 2019/0334515 A1 | 10/2019 | Nishimura |

* cited by examiner

SEMICONDUCTOR APPARATUS AND SEMICONDUCTOR CHIP

CROSS REFERENCE TO RELATED APPLICATION

This Application claims priority from Japanese Patent Application No. 2021-200176, filed Dec. 9, 2021, the entire contents of which are incorporated herein by reference.

BACKGROUND

Field of the Invention

The present disclosure relates to semiconductor apparatuses and to semiconductor chips.

Description of Related Art

Power converters using power semiconductor elements such as IGBTs (Insulated Gate Bipolar Transistors) carry out a bootstrap operation to generate a power supply voltage for controlling the power semiconductor elements from a predetermined control voltage.

Japanese Patent Application Laid-Open Publication No. 2014-90006 discloses that a resistive element and a diode connected in series to each other are used for the bootstrap operation.

In the technique described in Japanese Patent Application Laid-Open Publication No. 2014-90006, a sufficient area is required to install many elements, such as the resistive element and the diode described above, for control of the power semiconductor element.

SUMMARY

In view of the above circumstances, one aspect of the present disclosure has an object of reducing the area required to install elements for controlling the power semiconductor element.

To solve the above problems, a semiconductor apparatus according to one aspect of the present disclosure includes: a power semiconductor element; a control chip including a plurality of terminals including a first terminal and a second terminal, and being configured to control the power semiconductor element using a power supply voltage supplied to the second terminal; a first conductor for supplying a predetermined control voltage to the first terminal; a first line for supplying the power supply voltage to the second terminal; and a semiconductor chip including a diode that is used for a bootstrap operation for generating the power supply voltage, in which the semiconductor chip includes: a semiconductor substrate including a first face and a second face that are opposed to each other, and having a PN junction of the diode formed by a p-type semiconductor region on the first face and an n-type semiconductor region on the second face; an anode formed on the first face and joined to a surface of the first conductor; and a cathode formed on the second face and electrically connected to the second terminal via the first line.

A semiconductor chip according to yet another aspect of the present disclosure includes: a diode being used for a bootstrap operation for generating a power supply voltage, and being electrically connected between a first terminal and a second terminal among a plurality of terminals of a control chip controlling a power semiconductor element, where the first terminal is electrically connected to a first conductor supplied with a predetermined control voltage, and the second terminal is supplied with the power supply voltage; a semiconductor substrate: including a first face and a second face that are opposed to each other; and having a PN junction of the diode formed by a p-type semiconductor region on the first face and an n-type semiconductor region on the second face; an anode formed on the first face and joined to a surface of the first conductor; and a cathode formed on the second face and electrically connected to the second terminal via a first line.

A semiconductor chip according to yet another aspect of the present disclosure includes: a diode that is used for a bootstrap operation for generating a power supply voltage of a control chip controlling a power semiconductor element; a semiconductor substrate including a first face and a second face that are opposed to each other, and having a PN junction of the diode formed by a p-type semiconductor region on the first face and an n-type semiconductor region on the second face; an anode containing a metallic film made of nickel or nickel alloy on the first face; a cathode containing a metallic film made of aluminum or aluminum alloy on the second face; and a current-limiting resistive element electrically connected to the cathode.

DESCRIPTION OF EMBODIMENTS

Figure 1:
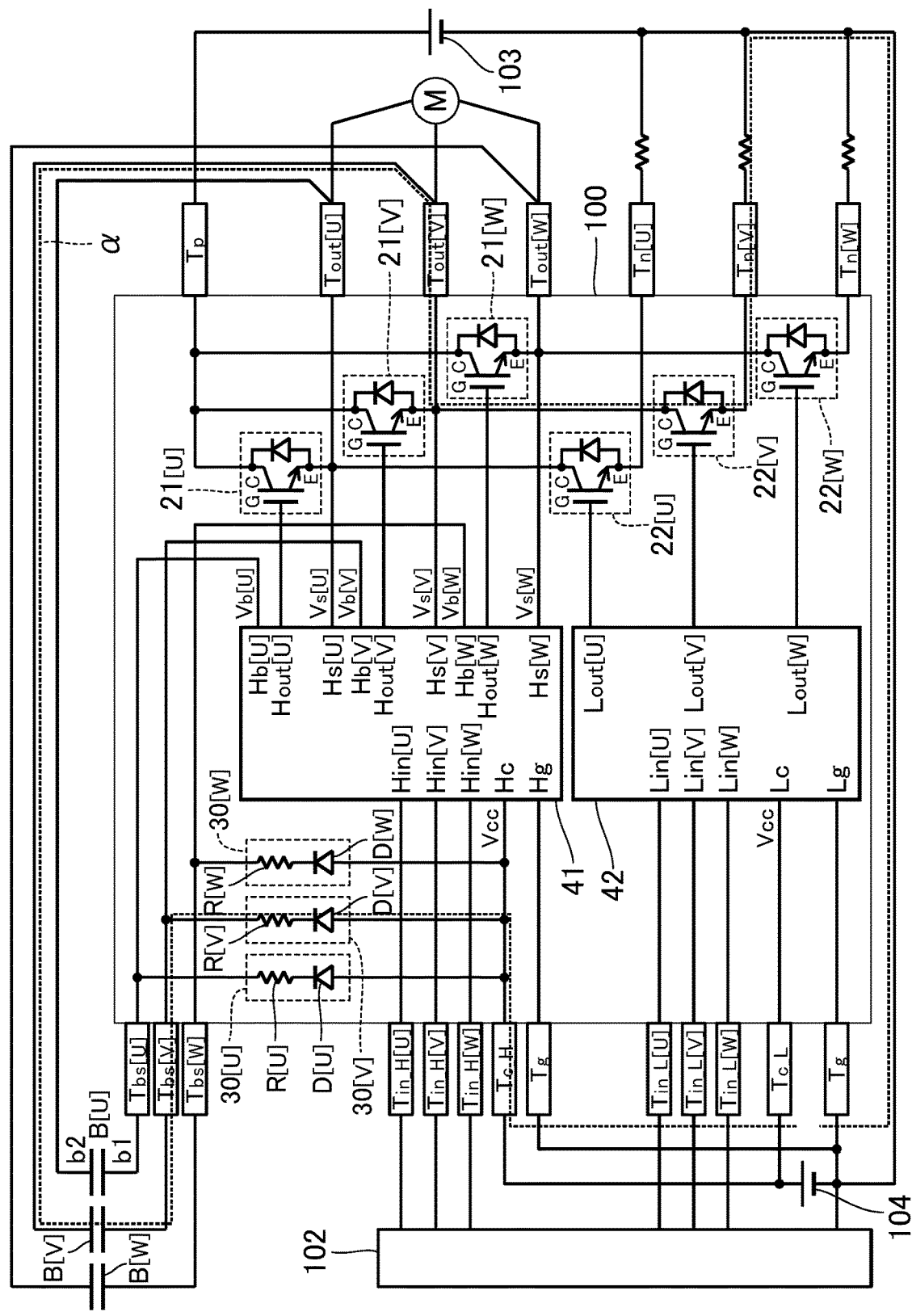
FIG. 1 is a circuit diagram illustrating an example of an electrical configuration of a semiconductor apparatus according to a first embodiment.

Embodiments of the present disclosure are explained with reference to the drawings. The dimensions and scales of parts in the drawings are different from actual products in some cases. The embodiments described below are assumed to be exemplary modes when the present disclosure is implemented. Therefore, the scope of the present disclosure is not limited to the embodiments exemplified below.

A: First Embodiment

FIG. 1 is a circuit diagram illustrating an example of an electrical configuration of a semiconductor apparatus 100.

The semiconductor apparatus 100 is an intelligent power module to be used as a three-phase inverter circuit that drives an electric motor M such as a three-phase motor. A control device 102 is connected to the semiconductor apparatus 100. The control device 102 is, for example, an external MPU (Micro Processing Unit) that controls the operation or the semiconductor apparatus 100.

Hereinafter, any one of the AC phases of the electric motor M is identified by a reference sign k. That is, the sign k means any of a U phase, a V phase, and a W phase (k=U, V, or W). For example, a [k] added to a reference sign indicates an element for each AC phase of the electric motor M. As illustrated in FIG. 1, the semiconductor apparatus 100 includes a plurality of connection terminals T (Tin_H[k], Tin_L[k], Tout[k], Tc_H, Tc_L, Tg, Tp, Tn[k], and Tbs[k]) for external connection.

The semiconductor apparatus 100 includes three drive chips 21[k] (21[U], 21[V], and 21[W]), three drive chips 22[k] (22[U], 22[V], and 22[W]), three semiconductor chips 30[k] (30[U], 30[V], and 30[W]), a control chip 41, and a control chip 42. The drive chip 21[k], the drive chip 22[k], and the semiconductor chip 30[k] are installed for each of the three phases (U, V and W phases) of the electric motor M.

Each of the drive chip 21[k] and the drive chip 22[k] is a reverse conducting (RC)-IGBT including an IGBT (Insulated Gate Bipolar Transistor) and an FWD (Free Wheeling Diode), and includes a main electrode E, a main electrode C, and a control electrode G. The main electrodes E and C are electrodes to and from which a current to be controlled is input or is output. The main electrode C acts as a cathode of the FWD and the main electrode E acts as an anode of the FWD. The control electrode G is a gate electrode to which a drive voltage for on-off control of the IGBT is applied. The drive chips 21[k] and 22[k] are examples of a "power semiconductor element."

Each set of the drive chips 21[k] and 22[k] constitutes a half-bridge circuit corresponding to one AC phase of the electric motor M. The drive chips 21[k] and 22[k] are connected in series between the connection terminals Tp and Tn[k]. The connection point between the drive chips 21[k] and 22[k] is electrically connected to the connection terminal Tout[k]. The connection terminal Tout[k] is an output terminal for supplying power to one AC phase of the electric motor M. A high power supply voltage is supplied from an external power source 103 to the connection terminal Tp. A low power supply voltage (a ground voltage) is supplied to the connection terminals Tn[k]. The three connection terminals Tn[k] may be replaced by one terminal common to the three phases.

The control chip 41 is an HVIC (High Voltage IC) that controls the drive chips 21[k] on the high-potential side. Although a mode in which the control chip 41 is made up of one chip is illustrated in the first embodiment, the control chip 41 may be made up of three chips corresponding to the different AC phases. As illustrated in FIG. 1, the control chip 41 includes terminals H (Hin[k], Hout[k], Hb[k], Hs[k], Hc, and Hg). That is, the control chip 41 includes the input terminal Hin[k], the output terminal Hout[k], the power supply terminal Hb[k], and the power supply terminal Hs[k] for each of the AC phases of the electric motor M.

A control signal supplied from the control device 102 to the connection terminal Tin_H[k] is input to the input terminal Hin[k]. The control signal is a signal for controlling the drive chip 21[k]. A high power supply voltage Vb[k] is supplied to the power supply terminal Hb[k], and a low power supply voltage Vs[k] is supplied to the power supply terminal Hs[k]. The control chip 41 operates on the power supply voltages supplied to the power supply terminal Hb[k] and the power supply terminal Hs[k], thereby to output a drive voltage according to the control signal supplied to the input terminal Hin[k], to the output terminal Hout[k]. The output terminal Hout[k] is electrically connected to the control electrode G of the IGBT in the drive chip 21[k]. As is clear from the above description, the control chip 41 controls the drive chip 21[k] using the power supply voltage Vb[k] supplied to the power supply terminal Hb[k]. The power supply terminal Hb[k] is an example of a "second terminal."

The control chip 41 further includes the voltage terminal Hc and the ground terminal Hg. A control voltage Vcc, which is a DC voltage required for the control chip 41, is supplied from the external power supply 104 to the voltage terminal Hc via the connection terminal Tc_H. The control voltage Vcc is also used for the bootstrap operation for generating the power supply voltage Vb[k] of the control chip 41. In addition, the ground terminal Hg is grounded. The voltage terminal Hc is an example of a "first terminal."

The control chip 42 is an LVIC (Low Voltage IC) that controls the drive chips 22[k] on the low-potential side. Although a mode in which the control chip 42 is made up of one chip is illustrated in the first embodiment, the control chip 42 may be made up of three chips corresponding to the different AC phases of the electric motor M. The control chip 41 and the control chip 42 may be a single chip. As illustrated in FIG. 1, the control chip 42 includes terminals L (Lin[k], Lout[k], Lc, and Lg). That is, the control chip 42 includes the input terminal Lin[k] and the output terminal Lout[k] for each of the AC phases of the electric motor M.

A control signal supplied from the control device 102 to the connection terminal Tin_L[k] is input to the input terminal Lin[k]. The control signal is a signal for controlling the drive chip 22[k]. The control chip 42 outputs a drive voltage according to the control signal supplied to the input terminal Lin[k], to the output terminal Lout[k]. The output terminal Lout[k] is electrically connected to the control electrode G of the IGBT in the drive chip 22[k]. That is, the control chip 42 controls the drive chips 22[k].

The control chip 42 further includes the voltage terminal Lc and the ground terminal Lg. A control voltage Vcc is supplied from the external power source 104 to the voltage terminal Lc via the connection terminal Tc_L. The control voltage Vcc supplied to the control chip 41 and the control voltage Vcc supplied to the control chip 42 may be different from each other. The ground terminal Lg is grounded.

As illustrated in FIG. 1, the power supply terminal Hb[k] of the control chip 41 is electrically connected to the connection terminal Tbs[k]. A capacitive element B[k] is electrically connected between the connection terminal Tbs[k] and the connection terminal Tout[k]. The capacitive element B[k] is a bootstrap capacitor that is external to the semiconductor apparatus 100 and is connectable thereto. Each capacitive element B[k] includes a first electrode b1 and a second electrode b2. The first electrode b1 is electrically connected to the connection terminal Tbs[k], and the second electrode b2 is electrically connected to the connection terminal Tout[k].

Each semiconductor chip 30[k] is connected between the connection terminal Tc_H and the connection terminal Tbs[k]. That is, the semiconductor chip 30[k] is connected between the voltage terminal Hc and the power supply terminal Hb[k] in the control chip 41. The semiconductor chip 30[k] is used for the bootstrap operation described above.

As illustrated in FIG. 1, the semiconductor chip 30[k] includes a diode D[k] and a resistive element R[k] connected in series to each other. The diode D[k] is a bootstrap diode constituting a path (a charging path α) for charging the capacitive element B[k] when the bootstrap operation. The resistive element R[k] limits the current flowing in the diode D[k] when the bootstrap operation. The anode of each of the diodes D[k] is electrically connected to the connection terminal Tc_H and the voltage terminal Hc. The cathode of each of the diodes D[k] is electrically connected to one end of the associated resistive element R[k]. The other end of the resistive element R[k] is electrically connected to the connection terminal Tbs[k] and the power supply terminal Hb[k].

In the above configuration, the bootstrap operation is performed by controlling the drive chip 22[k] to an on-state while keeping the drive chip 21[k] in an off-state. The charging path α illustrated in FIG. 1 is formed by control of the drive chip 22[k] into an on-state. Although only the charging path α passing through the semiconductor chip 30[V] is illustrated in FIG. 1 for the sake convenience, the charging path α is similarly formed also for the U and W phases.

The charging path α is a current path passing through the connection terminal Tc_H, the diode D[k], the resistive element R[k], the connection terminal Tbs[k], the capacitive element B[k], the connection terminal Tout[k], the drive chip 22[k], and the connection terminal Tn[k] in the order described above. The capacitive element B[k] is charged by the charging path α. Specifically, the voltage between both ends of the capacitive element B[k] is maintained at the control voltage Vcc by charging through the charging path α. Therefore, the power supply voltage Vb[k] supplied to the power supply terminal Hb[k] is set to a voltage higher than the power supply voltage Vs[k] of the power supply terminal Hs[k] by the control voltage Vcc. In this way, the bootstrap operation is an operation for generating the power supply voltage Vb[k] using the bootstrap circuit including the semiconductor chip 30[k] and the capacitive element B[k].

Figure 2:
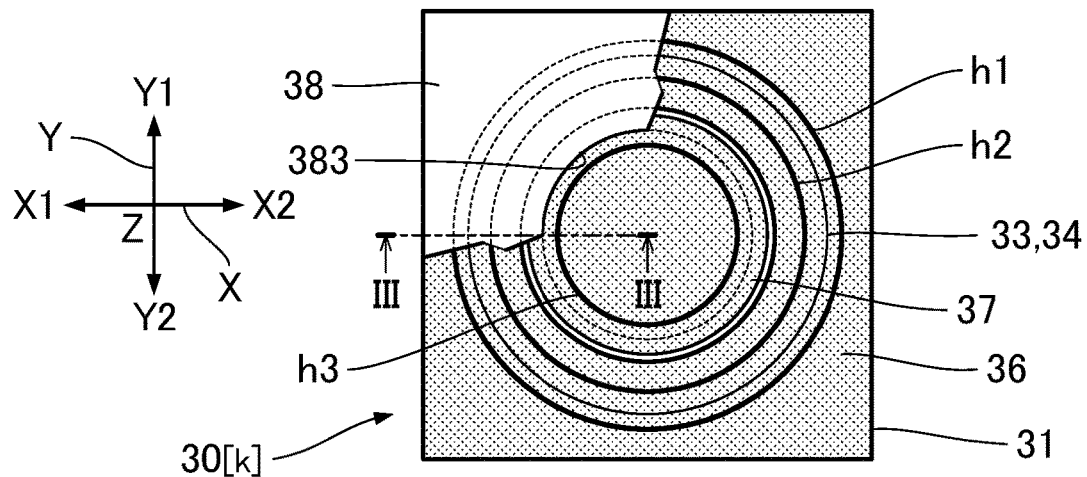
FIG. 2 is a plan view of a semiconductor chip including a diode.
Figure 3:
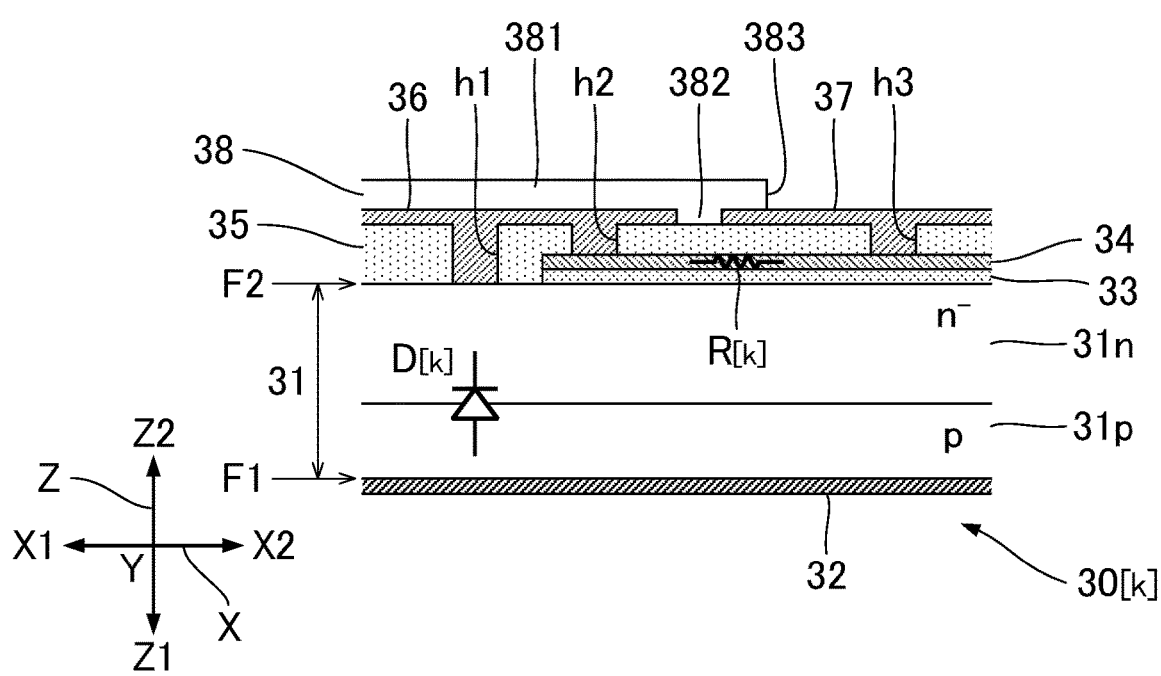
FIG. 3 is a cross-sectional view taken along line III-III in FIG. 2.

FIG. 2 is a plan view of the semiconductor chip 30[k]. FIG. 3 is a cross-sectional view taken along line III-III in FIG. 2. Hereinafter, as illustrated in FIGS. 2 and 3, it is assumed that the X-axis, the Y-axis, and the-Z axis are perpendicular to each other. One direction along the X-axis is represented as the X1 direction, whereas the direction opposite to the X1 direction is represented as the X2 direction. One direction along the Y-axis is represented as the Y1 direction, whereas the direction opposite to the Y1 direction is represented as the Y2 direction. Similarly, one direction along the Z-axis is represented as the Z1 direction, whereas the direction opposite to the Z1 direction is represented as the Z2 direction. Viewing any of the elements of the semiconductor apparatus 100 along the Z-axis direction (in the Z1 direction or the Z2 direction) is hereinafter called as "plan view."

The semiconductor apparatus 100 can be installed in any direction when in practical use. However, in the descriptions below, the Z1 direction is assumed to be a downward direction and the Z2 direction is assumed to be an upward direction for the sake of convenience. A surface of any element of the semiconductor apparatus 100, which faces in the Z1 direction, is referred to as an "underside," and another surface of the element, which faces in the Z2 direction, is referred to as "a topside."

As illustrated in FIGS. 2 and 3, the semiconductor chip 30[k] includes a semiconductor substrate 31 being rectangular in plan view. The semiconductor substrate 31 is plate shaped and is made of a semiconductor material such as silicon. In the first embodiment, the semiconductor substrate 31 is a p-type semiconductor substrate.

The semiconductor substrate 31 includes a first face F1 and a second face F2. The first face F1 and the second face F2 are principal surfaces of the semiconductor substrate 31, and they are opposed to each other. Specifically, the first face F1 faces in the Z1 direction, and the second face F2 faces in the Z2 direction. That is, the first face F1 is the underside of the semiconductor substrate 31, and the second face F2 is the topside of the semiconductor substrate 31.

A p-type semiconductor region 31p, in which electron holes as the majority carriers move, is formed on the first face F1. An n-type semiconductor region 31n, in which electrons as majority carriers move, is formed on the second face F2. The p-type semiconductor region 31p and the n-type semiconductor region 31n are joined to each other inside the semiconductor substrate 31. A PN junction of the diode D[k] is formed by the p-type semiconductor region 31p on the first face F1 and the n-type semiconductor region 31n on the second face F2. Accordingly, the first face F1 is adjacent to the anode of the diode D[k], and the second face F2 is remote from the cathode side of the diode D[k].

An anode 32 is formed on the first face F1. The anode 32 in the first embodiment is a conductive film in contact with the first face F1 and coats the entire area of the first face F1. However, the anode 32 may coat only a part of the first face F1. The anode 32 is made of a low-resistance metallic material. The anode 32 may be made up of a plurality of stacked layers of metallic films that are made of materials different from each other, as well as being made up of a single layer. Although details will be described later, the anode 32 is joined to a metallic die pad 65 with a conductive joining material such as solder or conductive paste. Therefore, it is desirable that the anode 32 contains, for example, a metallic film made of nickel or nickel alloy having a superior joining property to the joining material.

A first insulating layer 33, a resistive layer 34, and a second insulating layer 35 are stacked, in this order, on the second face F2. That is, the first insulating layer 33 is formed on the second face F2, the resistive layer 34 is formed on the first insulating layer 33, and the second insulating layer 35 is formed on the resistive layer 34. Therefore, the first insulating layer 33 is positioned between the second face F2 and the resistive layer 34, and the resistive layer 34 is positioned between the first insulating layer 33 and the second insulating layer 35. The first insulating layer 33 is an example of an "insulating layer."

The first insulating layer 33 and the resistive layer 34 are circular in shape and are formed on the second face F2 in plan view. The first insulating layer 33 is an insulating coating that coats the second face F2. Specifically, the first insulating layer 33 is, for example, an oxide film formed by oxidation of the semiconductor substrate 31. The resistive layer 34 is a high-resistance conductive film that coats the first insulating layer 33. Specifically, the resistive layer 34 is made of a material that is higher in resistivity than a cathode 36 and the anode 32. For example, the resistive layer 34 is made of polysilicon. The resistive element R[k] described above is made up of the resistive layer 34.

The second insulating layer 35 is an insulating coating that coats the entire area of the second face F2. The first insulating layer 33 and the resistive layer 34 are coated by the second insulating layer 35. The second insulating layer 35 is an oxide film made of an insulating material such as silicon oxide.

The cathode 36 and a connecting electrode 37 are formed on the second insulating layer 35. The cathode 36 and the connecting electrode 37 are formed in a lump by patterning a conductive film that coats the entire area of the second insulating layer 35. Therefore, the cathode 36 and the connecting electrode 37 are made of a common conductive material and have substantially the same film thicknesses. For example, the cathode 36 and the connecting electrode 37 are made of a low-resistance metallic material. The cathode 36 may be made up of a plurality of stacked layers of metallic films that are made of materials different from each other, as well as being made up of a single layer. Although details will be described later, a wire Qb[k] is bonded to the connecting electrode 37. Therefore, it is desirable that the cathode 36 and the connecting electrode 37 contain a metallic film made of aluminum or aluminum alloy suitable for connection of the wire Qb[k]. The cathode 36 and the connecting electrode 37 may each be made of different materials in separate processes.

The connecting electrode 37 is a circular electrode formed on a central portion of the second face F2. Specifically, the connecting electrode 37 is formed to overlap the resistive layer 34 in plan view. The cathode 36 is an electrode and has a shape surrounding the connecting electrode 37 in plan view. That is, a circular opening including the connecting electrode 37 is formed on the cathode 36. A predetermined spacing is provided between the outer peripheral edge of the connecting electrode 37 and the inner peripheral edge of the cathode 36. The cathode 36 includes a region on the inner peripheral overlapping the resistive layer 34 and a region on the outer peripheral not overlapping the resistive layer 34 in plan view. As is clear from the above explanations, the cathode 36 of the diode D[k] is formed on the second face F2.

A protective layer 38 is formed on the second face F2. The protective layer 38 is partially illustrated in FIG. 2. The protective layer 38 is an insulating coat that coats the cathode 36 and the connecting electrode 37. The protective layer 38 is made of an insulating resin material such as epoxy resin. The protective layer 38 includes (i) a coating portion 381 that coats the cathode 36 and the connecting electrode 37, and (ii) a partition portion 382 that is filled in the spacing between the cathode 36 and the connecting electrode 37. The cathode 36 and the connecting electrode 37 are electrically insulated from each other by the partition portion 382. A circular opening 383 is formed in a region of the coating portion 381 positioned on the inner side of the partition portion 382 in plan view. The connecting electrode 37 is exposed from the opening 383 of the protective layer 38. The connecting electrode 37 functions as a connection terminal for electrically connecting the semiconductor chip 30[k] to other elements.

As illustrated in FIGS. 2 and 3, a conduction hole h1, a conduction hole h2, and a conduction hole h3 are formed on the second insulating layer 35. The conduction hole h1 is a through-hole and has an annular shape in a region of the second insulating layer 35 on the outer side of the resistive layer 34 in plan view. The cathode 36 is conducted to the second face F2 (the n-type semiconductor region 31n) via the conduction hole h1. As is clear from the above explanations, the diode D[k] is formed by stacking the anode 32, the p-type semiconductor region 31p, the n-type semiconductor region 31n, and the cathode 36, in this order, in the Z2 direction.

Each of the conduction holes h2 and h3 is a through-hole and has an annular shape in a region of the second insulating layer 35 overlapping with the resistive layer 34 in plan view. The conduction hole h2 is formed in a region outside the partition portion 382, and the conduction hole h3 is formed in a region inside the partition portion 382. The cathode 36 is conducted to the resistive layer 34 via the conduction hole h2. That is, as illustrated in FIG. 1, the current-limiting resistive element R[k] is electrically connected to the cathode 36 of the diode D[k]. The connecting electrode 37 is conducted to the resistive layer 34 via the conduction hole h3. As is clear from the above explanations, the resistive element R[k] made up of the resistive layer 34 is interposed between the cathode 36 of the diode D[k] and the connecting electrode 37. The connecting electrode 37 may be expressed as the cathode 36 of the diode D[k].

As explained above, the current flowing in the diode D[k] in the bootstrap operation can be limited by the current-limiting resistive element R[k] according to the first embodiment. In the first embodiment, the resistive element R[k] is made up of the resistive layer 34 stacked on the second face F2 of the semiconductor substrate 31 with the first insulating layer 33 interposed therebetween. That is, the current-limiting resistive element R[k] can be easily formed by stacking the first insulating layer 33 and the resistive layer 34 on the second face F2. Furthermore, since the resistive element R[k] and the diode D[k] are integrally formed, the configuration of the semiconductor apparatus 100 is simplified as compared to a configuration in which the resistive element R[k] and the diode D[k] are separate components.

Figure 4:
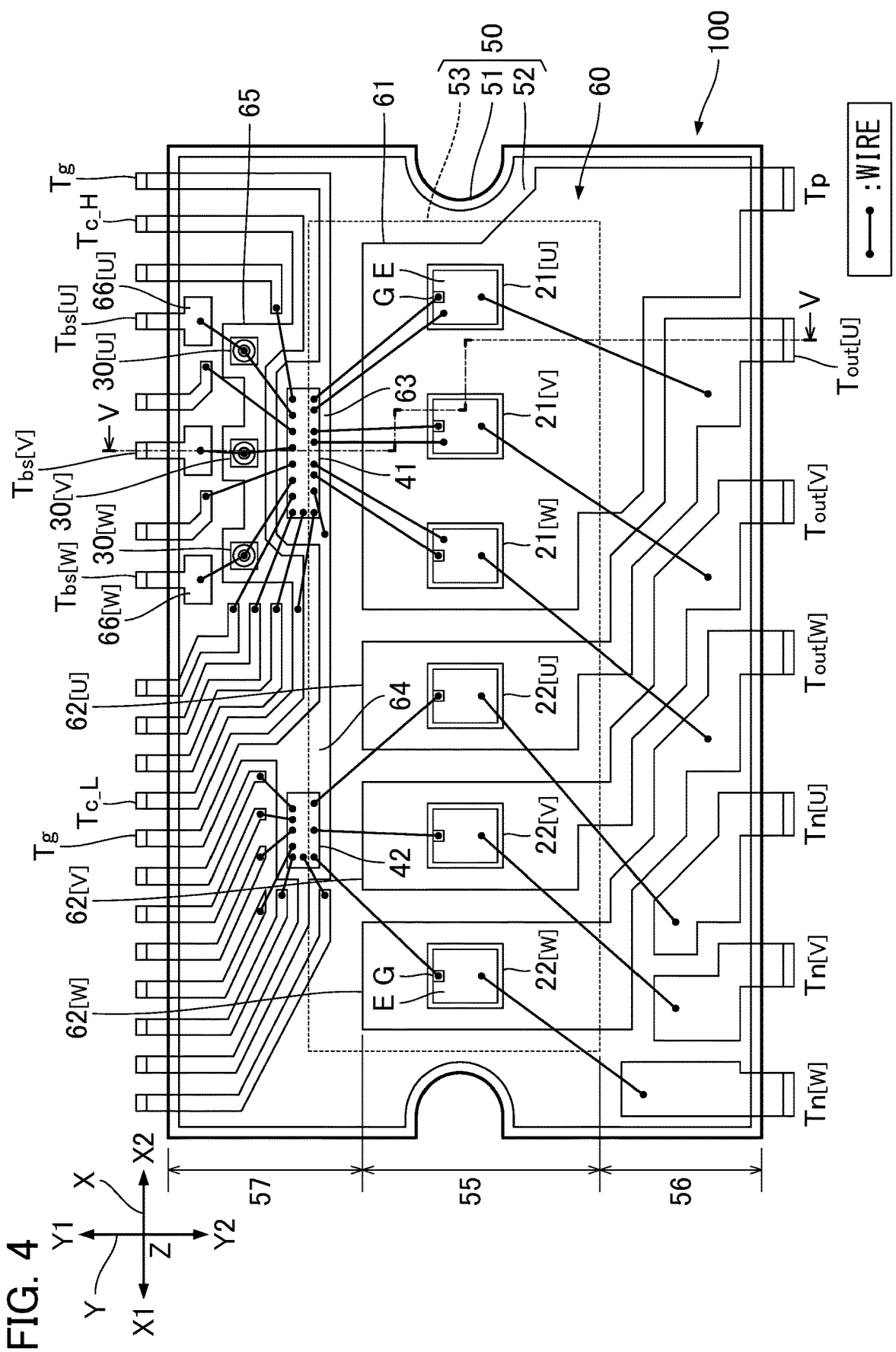
FIG. 4 is a plan view of the semiconductor apparatus.
Figure 5:
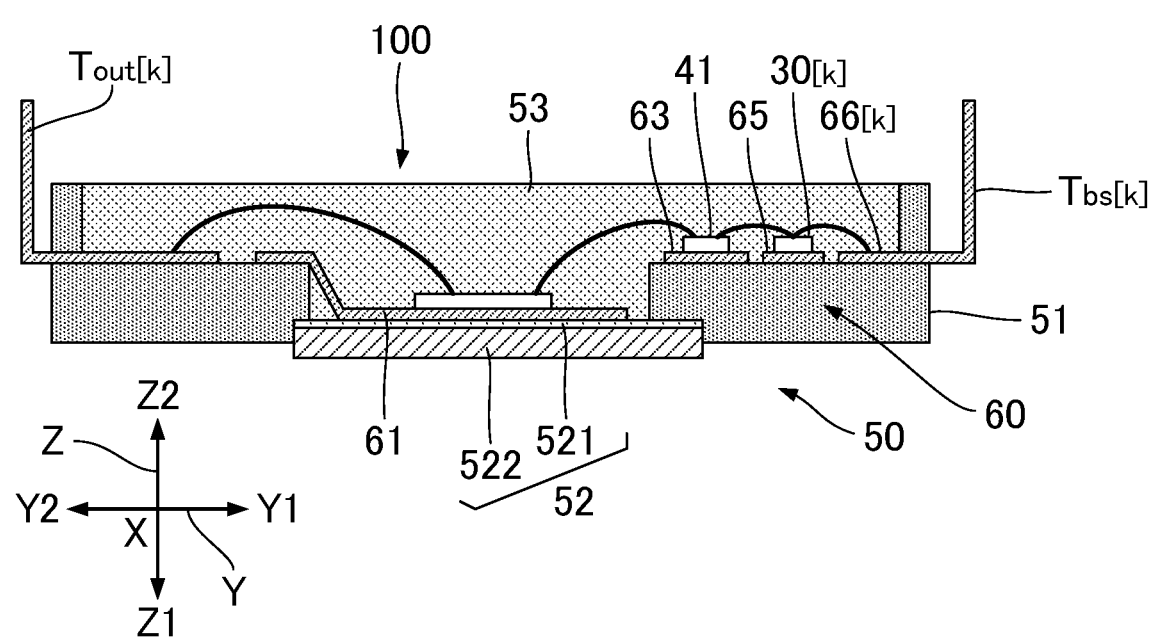
FIG. 5 is a cross-sectional view along line V-V in FIG. 4.

FIG. 4 is a plan view of the semiconductor apparatus 100 in the first embodiment. FIG. 5 is a cross-sectional view along a line V-V in FIG. 4.

As is clear from FIGS. 4 and 5, the X-axis direction corresponds to the longer direction of the semiconductor apparatus 100 (that is, the direction of the long sides of a rectangle constituting the outer shape), and the Y-axis direction corresponds to the shorter direction of the semiconductor apparatus 100 (that is, the direction of the short sides of the rectangle constituting the outer shape).

As illustrated in FIGS. 4 and 5, the semiconductor apparatus 100 includes a casing 50 that accommodates the elements illustrated in FIG. 1. The casing 50 includes a resin case 51, a support plate 52, and a sealing resin 53. The resin case 51 is a structure in a rectangular frame shape made of a resin material. The casing 50 is formed of a resin material such as PPS (polyphenylene sulfide) resin, PBT (polybutylene terephthalate) resin, PBS (poly butylene succinate) resin, PA (polyamide) resin, or ABS (acrylonitrile butadiene-styrene) resin, or other kinds of resin materials.

The support plate 52 is plate shaped and is made up of stacked layers including an insulating layer 521 and a heatsink 522 as illustrated in FIG. 5. The insulating layer 521 is made of a resin material such as epoxy resin and coats the topside of the heatsink 522. The heatsink 522 is plate shaped and is made of a metallic material with a high thermal conductivity, such as aluminum or copper. The support plate 52 is fixed to the resin case 51 to close the opening of the resin case 51. The three drive chips 21[k] (21[U], 21[V], and 21[W]), the three drive chips 22[k] (22[U], 22[V], and 22[W]), the three semiconductor chips 30[k] (30[U], 30[V], and 30[W]), the control chip 41, and the control chip 42 are accommodated in a space surrounded by the resin case 51, and the support plate 52 is at the bottom. The main electrode E and the control electrode G are formed on the topside of each of the drive chips 21[k] and the drive chips 22[k], and the main electrode C is formed on the underside thereof.

The sealing resin 53 is a resin filled in a space inside of the resin case 51 and seals the elements accommodated in the space. The sealing resin 53 is made of a resin material such as silicone gel or epoxy resin, or other kinds of resin materials. The sealing resin 53 may contain an insulating filler such as a silicon oxide filler, an aluminum oxide filler, or other kinds of insulating fillers, in addition to the resin material.

A lead frame 60 is installed on the casing 50. The lead frame 60 is a line made of a low-resistance metallic material such as copper or copper alloy. The lead frame 60 is in one piece with the resin case 51 and is formed by insert molding. The lead frame 60 is a conductive body including leads. The connection terminals T described above are end portions of the leads exposed outside from the casing 50.

As illustrated in FIG. 4, the casing 50 includes an element region 55, a terminal region 56, and a control region 57 in plan view. The element region 55, the terminal region 56, and the control region 57 are regions that are long along the X-axis. The element region 55 is positioned between the terminal region 56 and the control region 57.

Some connection terminals T (Tin_H[k], Tin_L[k], Tc_H, Tc[L], Tg, and Tbs[k]) relating to the operations of the control chip 41 and the control chip 42 among the connection terminals T are control terminals protruding in the Y1 direction from a side surface of the control region 57, and they are arranged to be spaced apart from each other along the X-axis.

Some connection terminals T (Tout[k], Tp, and Tn[k]) relating to the power to be supplied to the electric motor M among the connection terminals T are terminals protruding in the Y2 direction from a side surface of the terminal region 56, and are arranged to be spaced apart from each other along the X-axis.

As illustrated in FIG. 4, the lead frame 60 includes one die pad 61 and three die pads 62[k]. The die pad 61 and the die pads 62[k] are metallic plates positioned in the element region 55 in plan view. The three drive chips 21[k] are mounted on the die pad 61. One drive chip 22[k] is mounted on each of the die pads 62[k]. A conductive joining material such as solder or a sintered metallic material is used for mounting of the drive chips 21[k] and the drive chips 22[k]. As is clear from the above explanations, the three drive chips 21[k] and the three drive chips 22[k] are installed in the element region 55. The three die pads 62[k] may be replaced by a single die pad.

The lead frame 60 includes leads extending from the connection terminal Tp, the connection terminals Tout[k], and the connection terminals Tn[k]. The connection terminal Tp is coupled to the die pad 61 via the lead. The main electrode C on the underside of each of the drive chips 21[k] is electrically connected to the connection terminal Tp. Each of the connection terminals Tout[k] is coupled to the associated die pad 62[k] via the lead. Each of the connection terminals Tout[k] is electrically connected to the main electrode E on the topside of the associated drive chip 21[k] by a wire. As illustrated in FIG. 1, the main electrode E of the drive chip 21[k] and the main electrode C on the underside of the drive chip 22[k] are electrically connected to the connection terminal Tout[k]. The connection terminal Tn[k] is electrically connected to the main electrode E on the topside of the associated drive chip 22[k] by a wire.

As illustrated in FIG. 4, the lead frame 60 further includes a die pad 63, a die pad 64, a die pad 65, and three connecting pads 66[k]. The die pad 63, the die pad 64, the die pad 65, and the connecting pads 66[k] are metallic plates located in the control region 57 in plan view.

The lead frame 60 includes leads extending from the controlling connection terminals T (Tin_H[k], Tin_L[k], Tc_H, Tc_L, Tg, and Tbs[k]) relating to the operation for the control chip 42. Each of the die pad 63 and the die pad 64 is coupled to the connection terminal Tg via the lead. The die pad 63 and the die pad 64 are coupled to each other via the lead. The ground voltage is supplied to the die pad 63 and the die pad 64 from the connection terminal Tg. The die pad 63, the die pad 64, the connection terminals Tg, and the leads coupling these elements (63, 64, and Tg) may be integrally formed.

The control chip 41 is joined to the surface of the die pad 63. An insulating adhesive is used for mounting of the control chip 41, and thereby the underside of the control chip 41 is electrically insulated from the die pad 63. The die pad 63 is an example of a "third conductor."

One, some, or all of the die pad 63, the die pad 64, the connection terminals Tg, and the leads coupling these elements (63, 64, and Tg) may be the "third conductor."

The terminals H described above are formed on the topside of the control chip 41. The terminals H of the control chip 41 are electrically connected to the drive chips 21[k] or the connection terminals T with wires, respectively. For example, the output terminal Hout[k] of the control chip 41 is connected to the control electrode G on the topside of the drive chip 21[k], and the power supply terminal Hs[k] is connected to the main electrode E on the topside of the drive chip 21[k]. The voltage terminal Hc is connected to the lead coupled to the connection terminal Tc_H, and the ground terminal Hg is connected to the lead coupled to the connection terminal Tg.

As described above, in the first embodiment, the control chip 41 is joined to the surface of the die pad 63 that is supplied with the ground voltage. That is, the control chip 41 is installed to overlap with the die pad 63 in plan view. Accordingly, the ground terminal Hg supplied with the ground voltage among the terminals H of the control chip 41 can be easily connected to the die pad 63.

As illustrated in FIG. 4, the control chip 42 is joined to the surface of the die pad 64. An insulating adhesive is used for mounting of the control chip 42, and thereby, the underside of the control chip 42 is electrically insulated from the die pad 64. The terminals L described above are formed on the topside of the control chip 42. The terminals L of the control chip 42 are electrically connected to the drive chips 22[k] or the connection terminals T with wires, respectively. For example, the output terminal Lout[k] of the control chip 42 is connected to the control electrode G on the topside of the drive chip 22[k]. The voltage terminal Lc is connected to the lead coupled to the connection terminal Tc_L, and the ground terminal Lg is connected to the lead coupled to the connection terminal Tg.

The die pad 65 is coupled to the connection terminal Tc_H via the lead. The control voltage Vcc is supplied to the die pad 65 from the connection terminal Tc_H. The die pad 65 is a conductor for supplying the control voltage Vcc to the voltage terminal Hc of the control chip 41. The die pad 65, the connection terminal Tc_H, and the lead coupling these elements (65 and Tc_H) can be integrally formed. The die pad 65 is an example of a "first conductor." One, some, or all of the die pad 65, the connection terminal Tc_H, and the lead coupling these members (65 and Tc_H) may be the "first conductor."

The connecting pads 66[k] each are coupled to the associated connection terminals Tbs[k] via the leads. The three connecting pads 66[k] are arrayed along the X-axis to be spaced from each other. Specifically, the three connecting pads 66 [k] are arrayed along a peripheral edge of the casing 50 located in the Y1 direction. As described above, the capacitive element B[k] is connected to the connection terminal Tbs[k]. That is, the capacitive element B[k] is connected to the connecting pad 66[k] external to the semiconductor apparatus 100. The connecting pad 66[k], the connection terminal Tbs[k], and the lead coupling these members (66[k] and Tbs[k]) may be integrally formed. The connecting pad 66[k] and the connection terminal Tbs[k] are an example of a "second conductor." One, some, or all of the connecting pad 66[k], the connection terminal Tbs[k], and the lead coupling these members (66[k] and Tbs[k]) may be the "second conductor."

As illustrated in FIG. 4, the die pad 63 is positioned between the drive chips 21[k] and the die pad 65 in plan view. Specifically, the die pad 63 (the control chip 41) is positioned between the array of the three drive chips 21[k] and the die pad 65. The die pad 65 is positioned between the die pad 63 and the connecting pads 66[k] in plan view. Specifically, the die pad 65 is positioned between the array of the three connecting pads 66[k] and the die pad 63 (the control chip 41).

Figure 6:
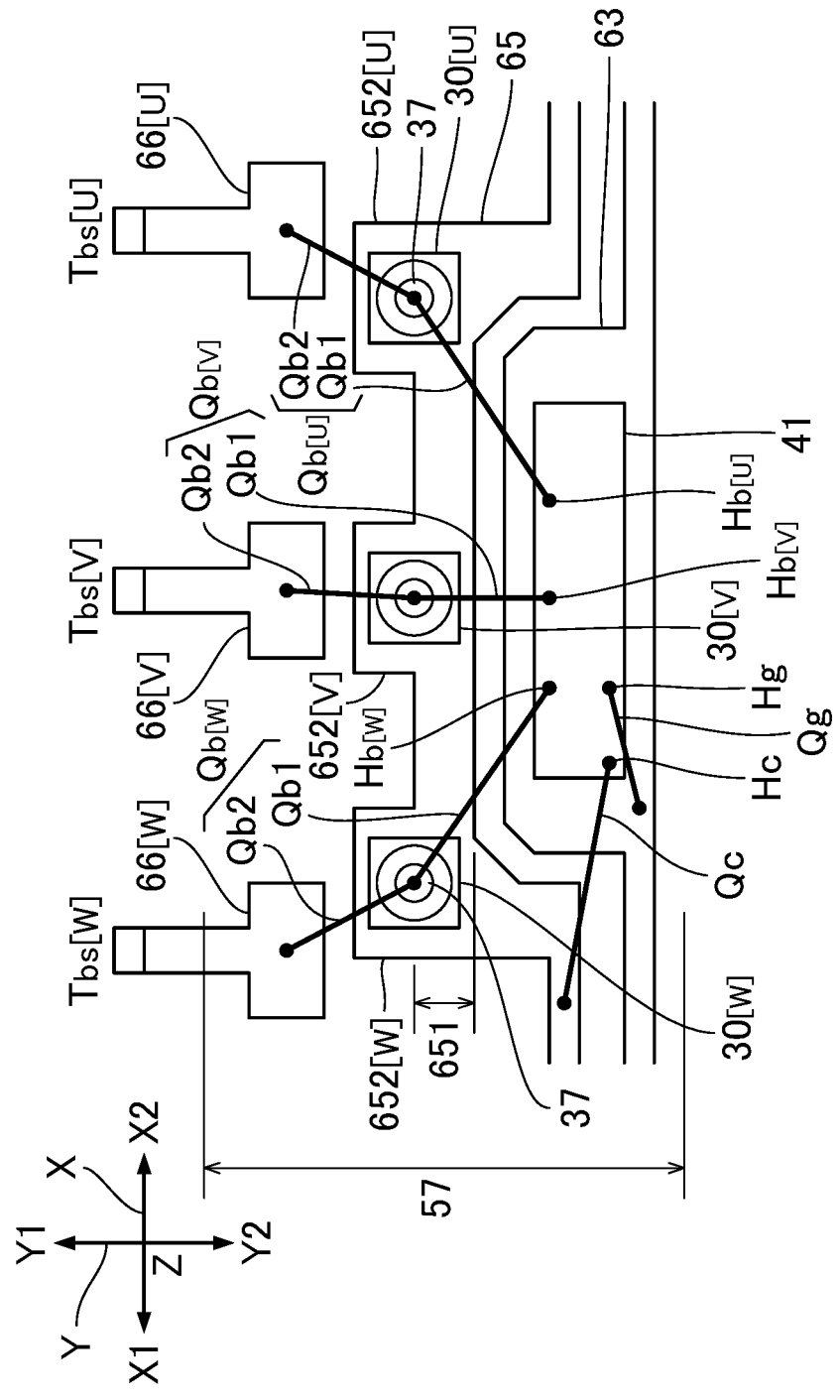
FIG. 6 is a plan view, enlarged, illustrating the vicinity of semiconductor chips in the semiconductor apparatus.

FIG. 6 is a plan view, enlarged, illustrating the vicinity of the semiconductor chips 30[k] in the semiconductor apparatus 100. Illustrations of elements not related to the following explanations among the elements illustrated in FIG. 4 are omitted in FIG. 6 for the sake of convenience. As illustrated in FIG. 6, the ground terminal Hg on the topside of the control chip 41 is electrically connected to the die pad 63 via a wire Qg. The voltage terminal Hc on the topside of the control chip 41 is electrically connected to the die pad 65 via a wire Qc.

As illustrated in FIG. 6, the die pad 65 includes a first portion 651, and three second portions 652[k] (652[U], 652[V], and 652[W]). The first portion 651 is a portion extending linearly along the X-axis. The second portions 652[k] are rectangular portions protruding in the Y1 direction from a peripheral edge of the first portion 651 positioned in the Y1 direction. The second portions 652[k] can be described as portions protruding from the peripheral edge of the first portion 651 toward the opposite side to the control chip 41 and the die pad 63. The three second portions 652[k] are arrayed along the X-axis so as to be spaced apart from each other.

The three semiconductor chips 30[k] are installed on the die pad 65. The semiconductor chips 30[k] each are installed at locations corresponding to the second portions 652[k] in plan view. Specifically, a portion of the semiconductor chip 30[k] positioned in the Y1 direction overlaps the second portion 652[k] in plan view. That is, the semiconductor chip 30[k] overlaps the first portion 651 and the second portion 652[k] in plan view. With the above configuration, a sufficient region in which the semiconductor chips 30[k] are installed can be allocated by the second portions 652[k] in the die pad 65 protruding from the first portion 651 in plan view. A mode in which the entirety of the semiconductor chip 30[k] overlaps the second portion 652[k] is also assumed.

As is clear from the above explanations, the three semiconductor chips 30[k] are arrayed along the X-axis so as to be spaced apart from each other.

The three semiconductor chips 30[k] are positioned between the array of the three drive chips 21[k] and the array of the three connecting pads 66[k]. Specifically, the three semiconductor chips 30[k] are installed between the control chip 41 and the array of the three connecting pads 66[k].

The semiconductor chip 30[k] is joined to the die pad 65 in a state in which the anode 32 is directed to the die pad 65. That is, the anode 32 positioned on the underside of the semiconductor chip 30[k] is joined to the surface of the die pad 65. The semiconductor chip 30[k] is joined to the die pad 65 with a conductive joining material such as solder or conductive paste. Accordingly, the anode 32 of the semiconductor chip 30[k] is electrically connected to the die pad 65 (and to the connection terminal Tc_H). That is, the anode 32 is electrically connected to the die pad 65 by mounting the semiconductor chip 30[k] on the die pad 65. The connecting electrode 37 of the semiconductor chip 30[k] faces in the Z2 direction in a state in which the semiconductor chip 30[k] is mounted on the die pad 65. That is, the connecting electrode 37 is positioned on the topside of the semiconductor chip 30[k].

As illustrated in FIG. 6, the power supply terminal Hb[k] of the control chip 41, the connecting electrode 37 of the semiconductor chip 30[k], and the connecting pad 66[k] are electrically connected with the wire Qb[k]. The wire Qb[k] is a linear conductive body formed by wire bonding. Each wire Qb[k] is made up of a first line Qb1 and a second line Qb2.

The first line Qb1 is a line electrically connecting the power supply terminal Hb[k] of the control chip 41 to the connecting electrode 37 of the semiconductor chip 30[k]. Specifically, one end of the first line Qb1 is joined to the surface of the power supply terminal Hb[k], and the other end of the first line Qb1 is joined to the surface of the connection terminal 37. That is, the power supply terminal Hb[k] is electrically connected to the cathode 36 of the diode D[k] via the first line Qb1.

The second line Qb2 is a line electrically connecting the connecting electrode 37 of the semiconductor chip 30[k] to the connecting pad 66[k]. Specifically, one end of the second line Qb2 is joined to the surface of the connecting electrode 37, and the other end of the second line Qb2 is joined to the surface of the connecting pad 66[k]. That is, the connecting pad 66[k] is electrically connected to the cathode 36 of the diode D[k] via the second line Qb2. According to the above configuration, the capacitive element B[k] of a desired capacitance, which is externally connected to the semiconductor apparatus 100, can be used for the bootstrap operation. The first line Qb1 and the second line Qb2 are lines for supplying the power supply voltage Vb[k] to the power supply terminal Hb[k] of the control chip 41.

In the first embodiment, a portion (a coupling portion) at which each of the first lines Qb1 and the associated second line Qb2 are coupled to each other is a stitch formed on the surface of the connecting electrode 37 of the associated semiconductor chip 30[k]. That is, the first line Qb1 and the second line Qb2 are coupled to each other via the stitch on the second face F2 of the associated semiconductor chip 30[k]. Specifically, an end of the first line Qb1 joined to the associated connecting electrode 37 and an end of the associated second line Qb2 joined to the connecting electrode 37 form the stitch on the second face F2. As is clear from the above explanations, the power supply terminal Hb[k] of the control chip 41, the connecting electrode 37 (the cathode 36 of the diode D[k]) of the semiconductor chip 30[k], and the connecting pad 66[k] are electrically connected to each other by stitch bonding. That is, the first line Qb1 and the second line Qb2 are continuously formed in a series of processes to form each of the wires Qb[k].

Figure 7:
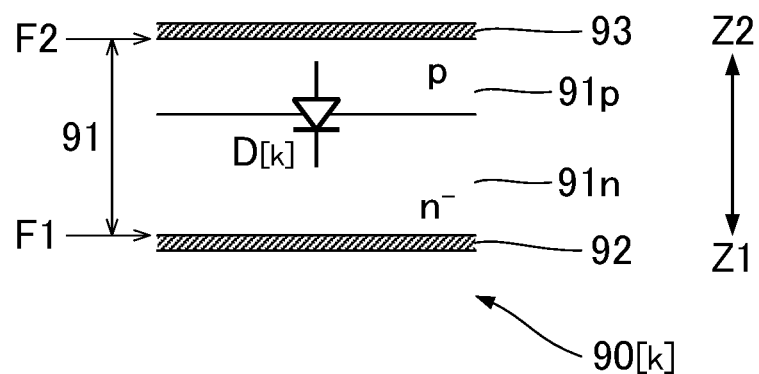
FIG. 7 is a cross-sectional view of a semiconductor chip according to a Comparative Example.

As the configuration of the diode D[k] to be used for the bootstrap operation, a form (hereinafter, referred to as "Comparative Example") illustrated in FIG. 7 is assumed in addition to the configuration described above and illustrated in FIGS. 2 and 3. FIG. 7 is a cross-sectional view of a semiconductor chip 90[k] according to the Comparative Example. The semiconductor chip 90[k] in the Comparative Example includes an n-type semiconductor substrate 91 including the first face F1 and the second face F2. An n-type semiconductor region 91n is formed on the first face F1 of the semiconductor substrate 91, and a p-type semiconductor region 91p is formed on the second face F2 of the semiconductor substrate 91. A PN junction of the diode D[k] is formed by joining of the p-type semiconductor region 91p on the second face F2 to the n-type semiconductor region 91n on the first face F1. A cathode 92 is formed on the first face F1, and an anode 93 is formed on the second face F2. That is, the orientations of the diodes D[k] in the first embodiment and the Comparative Example are opposite to each other.

Figure 8:
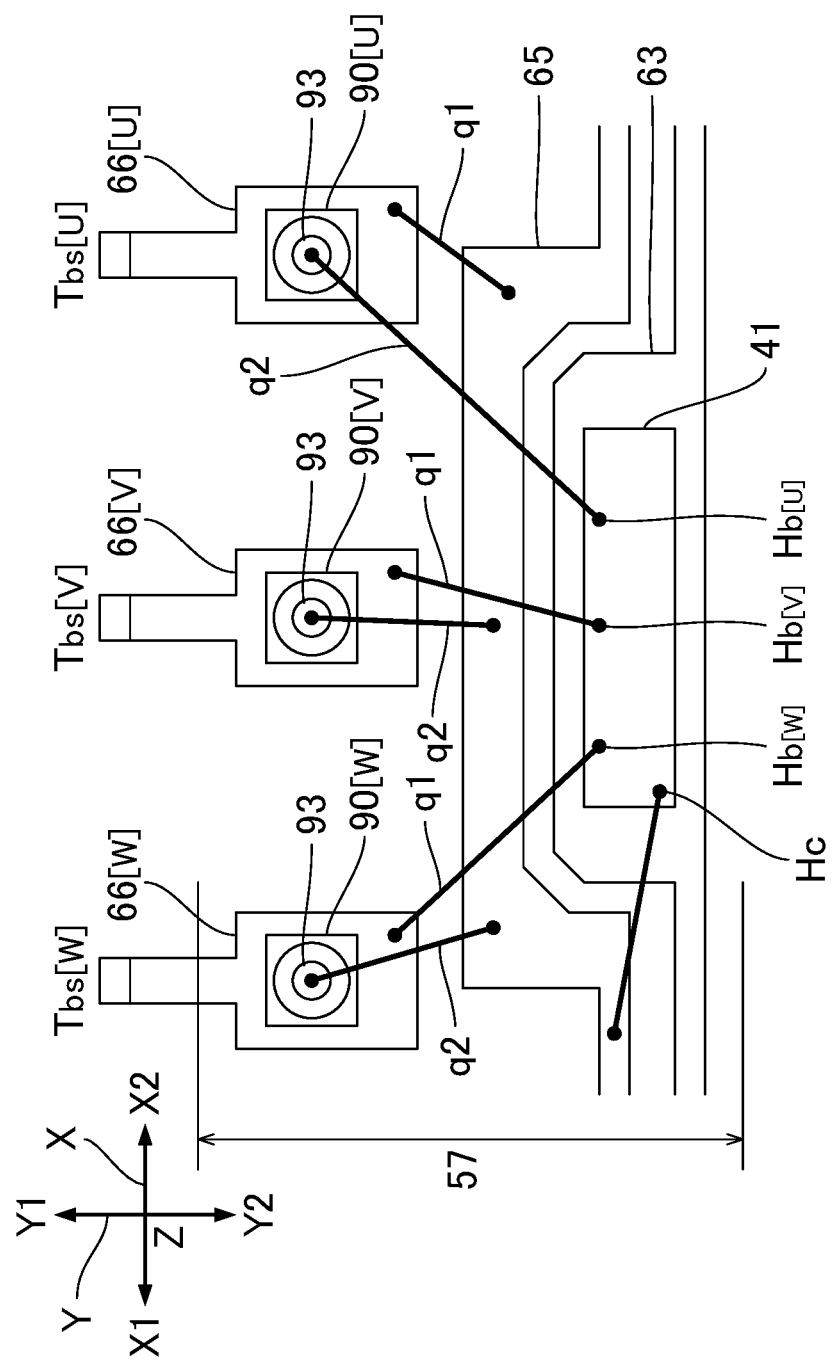
FIG. 8 is a plan view, enlarged, illustrating the vicinity of the semiconductor chips in the Comparative Example.

FIG. 8 is a plan view, enlarged, illustrating the vicinity of the semiconductor chips 90[k] in the Comparative Example. As illustrated in FIG. 8, the die pad 63, the die pad 65, and the three connecting pads 66[k] are installed in the control region 57 of the semiconductor apparatus 100 according to the Comparative Example. The control chip 41 is mounted on the die pad 63.

As described above, in the semiconductor chip 90[k] according to the Comparative Example, the cathode 92 to be connected to the connection terminal Tbs[k] is formed on the underside, and the anode 93 to be connected to the connection terminal Tc_H is formed on the topside. The semiconductor chip 90[k] is joined to the associated connecting pad 66[k]. That is, the cathode 92 formed on the first face F1 is joined to the surface of the associated connecting pad 66[k]. The power supply terminal Hb[k] of the control chip 41 is electrically connected to the associated connecting pad 66[k] via a wire q1. Accordingly, a sufficient area for installation of the associated semiconductor chip 90[k] and connection of the wire q1 needs to be allocated to each of the connecting pads 66[k]. The voltage terminal Hc on the topside of the control chip 41 is electrically connected to the anode 93 on the topside of each of the semiconductor chips 90[k] via a wire q2. The wires q1 and q2 are separate lines.

In contrast to the Comparative Example explained above, the anode 32 of the diode D[k] is formed on the first face F1 of the semiconductor substrate 31, and the anode 32 is joined to the die pad 65 for supplying the control voltage Vcc to the control chip 41 in the first embodiment. That is, the diode D[k] is installed to direct the anode 32 to the die pad 65.

The cathode 36 formed on the second face F2 of the semiconductor substrate 31 is electrically connected to the power supply terminal Hb[k] of the control chip 41 via the wire Qb[k]. As a result of adoption of the above configuration for the semiconductor chip 30[k], the semiconductor chip 30[k] is directly mounted on the die pad 65 in the first embodiment. That is, since the semiconductor chip 30[k] does not need to be joined to the connecting pad 66[k], the area of the connecting pad 66[k] is reduced relative to the Comparative Example.

According to the first embodiment, the control region 57 can be reduced relative to the Comparative Example in which the semiconductor chip 90[k] is mounted on the connecting pad 66[k]. That is, the first embodiment can reduce scale of the semiconductor apparatus 100 relative to the Comparative Example.

In a case in which the size of the semiconductor apparatus 100 is maintained to be the same as that in the Comparative Example, the element region 55 can be enlarged by the reduction of the control region 57. According to the first embodiment, the drive chip 21[k] and the drive chip 22[k] that are larger and that can control a larger current can be installed in the element region 55 relative to the Comparative Example. That is, the first embodiment can improve the power density. As in the above explanations, the first embodiment can provide both the downscaling of the semiconductor apparatus 100 and the improvement of the power density.

In the Comparative Example, each of the wires q1 for connecting the power supply terminal Hb[k] and the connecting pad 66[k], and each of the wires q2 for connecting the anode 93 and the die pad 65 (the voltage terminal Hc) need to be separately formed. In contrast to the Comparative Example, the power supply terminal Hb[k], the diode D[k], and the connecting pad 66[k] are electrically connected with one wire Qb[k] including a stitch formed on the semiconductor chip 30[k] in the first embodiment. The first embodiment can simplify the process of electrically connecting the power supply terminal Hb[k], the diode D[k], and the connecting pad 66[k] relative to the Comparative Example.

In the first embodiment, the drive chips 21[k], the die pad 63, the die pad 65, and the connecting pads 66[k] are arrayed in the order described above in the Y1 direction in plan view. Therefore, the power supply terminal Hb[k] of the control chip 41 joined to the die pad 63, the semiconductor chip 30[k] joined to the die pad 65, and the connecting pad 66[k] can be effectively connected.

B: Second Embodiment

A second embodiment of the present disclosure will be described. In the respective modes exemplified below, elements of which functions are identical to those of the first embodiment are denoted with reference signs used in the explanations of the first embodiment and detailed explanations thereof are omitted as appropriate.

Figure 9:
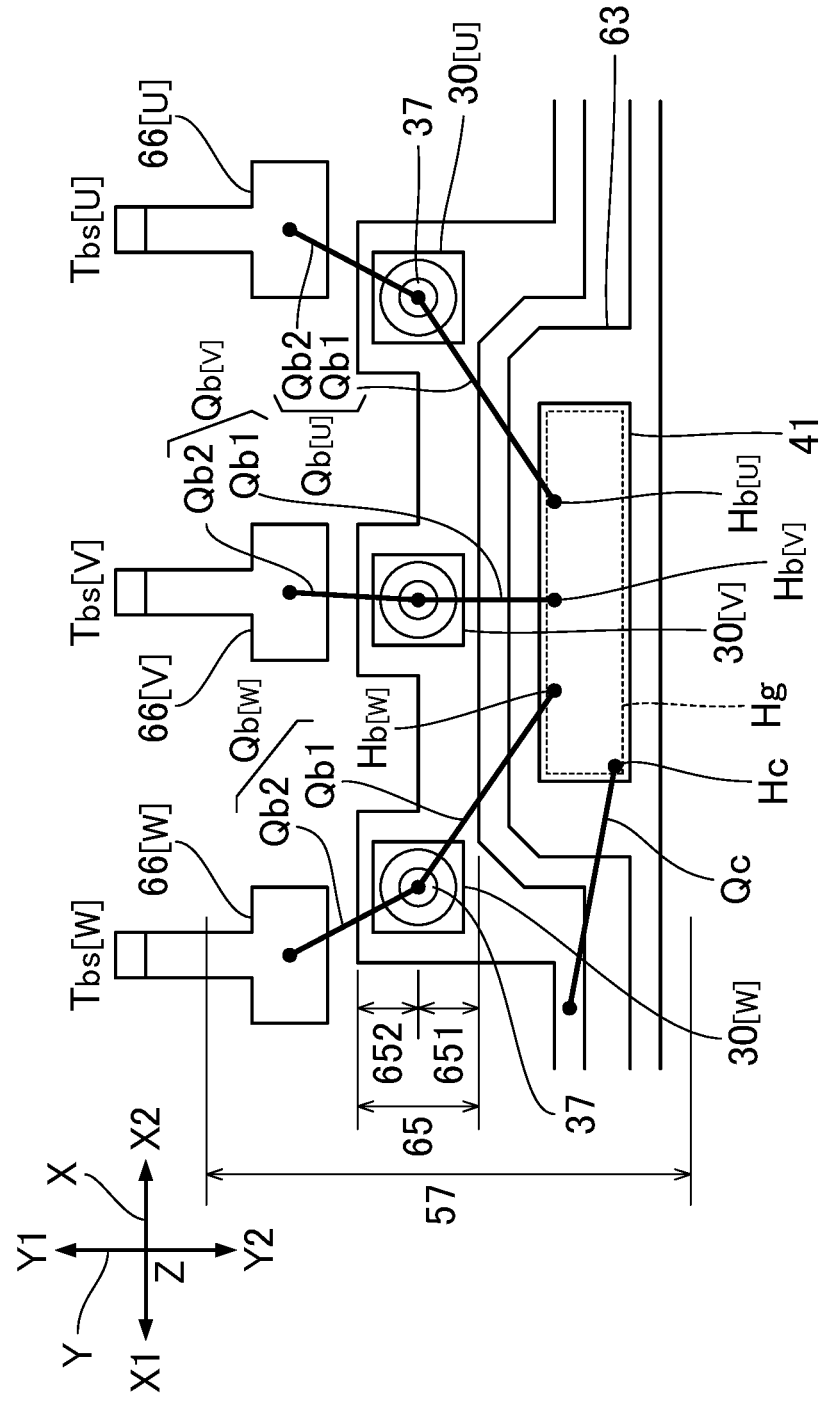
FIG. 9 is a plan view, enlarged, illustrating the vicinity of semiconductor chips according to a second embodiment.

FIG. 9 is a plan view, enlarged, illustrating the vicinity of the semiconductor chips 30[k] in the semiconductor apparatus 100 according to the second embodiment. As illustrated in FIG. 9, the control chip 41 in the second embodiment includes the ground terminal Hg. The ground terminal Hg in the second embodiment is a terminal formed on a surface directed to the die pad 63 (that is, the underside) of the control chip 41. Similarly to the first embodiment, a ground voltage is supplied to the die pad 63.

In the first embodiment, the control chip 41 is joined to the die pad 63 with the insulating adhesive, as described above. The control chip 41 in the second embodiment is joined to the die pad 63 with a conductive joining material such as solder or conductive paste.

Therefore, the ground terminal Hg on the underside of the control chip 41 is electrically connected to the die pad 63. That is, the ground voltage is supplied to the ground terminal Hg of the control chip 41 via the die pad 63. The second embodiment is the same as the first embodiment except that the ground terminal Hg on the underside of the control chip 41 is joined to the die pad 63.

Effects identical to those in the first embodiment are also provided in the second embodiment. Furthermore, in the second embodiment, the ground terminal Hg of the control chip 41 can be electrically connected to the die pad 63 by a simple process of joining the control chip 41 to the die pad 63 with a conductive joining material. That is, the wire Qg (FIG. 6) described above that electrically connects the ground terminal Hg to the die pad 63 is not required. However, the wire Qg may be installed also in the second embodiment similarly to the first embodiment.

C: Third Embodiment

Figure 10:
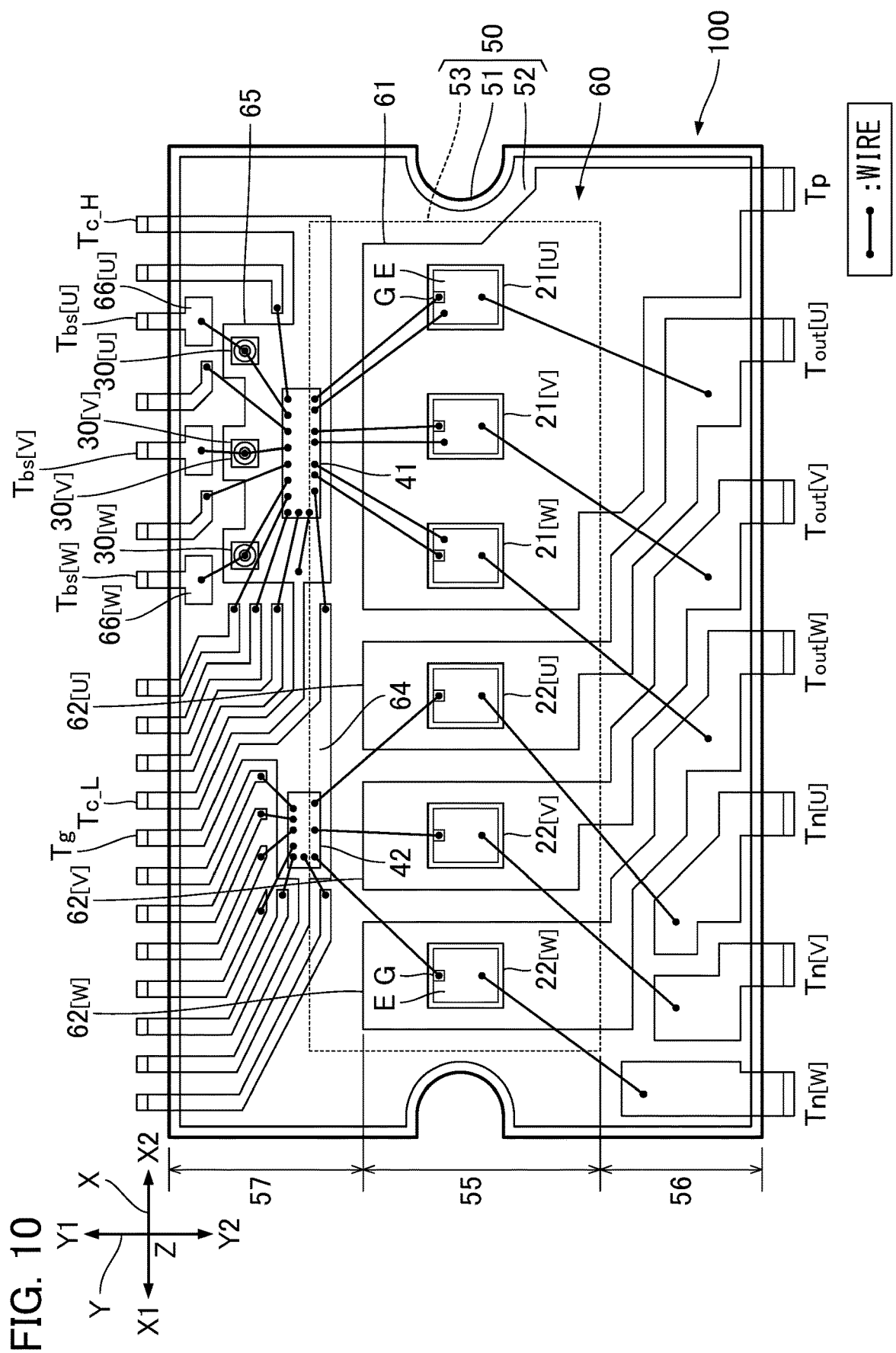
FIG. 10 is a plan view of a semiconductor apparatus according to a third embodiment.

FIG. 10 is a plan view of the semiconductor apparatus 100 according to a third embodiment. As illustrated in FIG. 10, the die pad 63 illustrated in the first embodiment is omitted in the third embodiment. The control chip 41 mounted on the die pad 63 in the first embodiment is mounted on the die pad 65 in the third embodiment. That is, the control chip 41 and the three semiconductor chips 30[k] (30[U], 30[V], and 30[W]) are mounted on the die pad 65 in the third embodiment.

As illustrated in FIG. 10, the die pad 65 is positioned between the drive chips 21[k] and the connecting pads 66[k] in plan view. That is, the drive chips 21[k], the die pad 65, and the connecting pads 66[k] are arrayed in this order in the Y1 direction in plan view. Specifically, the die pad 65 (the control chip 41) is positioned between the array of the three drive chips 21[k] and the array of the three connecting pads 66[k].

Figure 11:
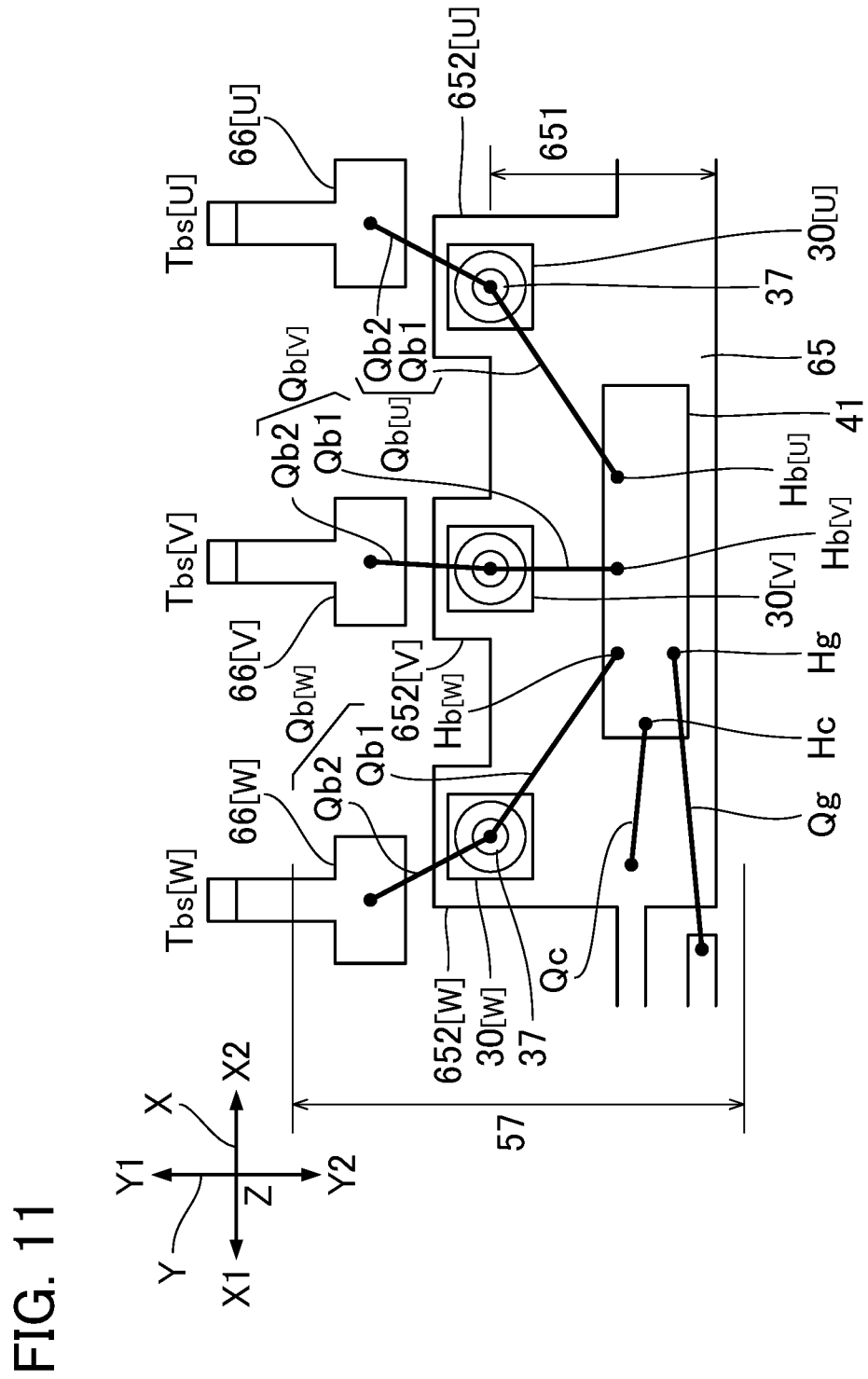
FIG. 11 is a plan view, enlarged, illustrating the vicinity of semiconductor chips according to the third embodiment.

FIG. 11 is a plan view, enlarged, illustrating the vicinity of the semiconductor chips 30[k] in the semiconductor apparatus 100. Illustrations of elements not related to the following explanations among the elements illustrated in FIG. 10 are omitted in FIG. 11 for the sake of convenience. As illustrated in FIG. 11, the ground terminal Hg formed on the topside of the control chip 41 is electrically connected to the lead coupled to the connection terminal Tg via the wire Qg. The voltage terminal Hc of the control chip 41 is electrically connected to the die pad 65 via the wire Qc.

The die pad 65 includes the first portion 651 and the three second portions 652[k] in a manner similar to the first embodiment. The first portion 651 is a rectangular portion that is long in the X-axis direction. The second portions 652[k] are rectangular portions protruding in the Y1 direction from the peripheral edge of the first portion 651 located in the Y1 direction, similarly to the first embodiment. The semiconductor chip 30[k] is installed at a location corresponding to the second portion 652[k] in plan view. Specifically, the semiconductor chip 30[k] overlaps the first portion 651 and the second portion 652[k] in plan view. Therefore, the three semiconductor chips 30[k] are arrayed along the X-axis so as to be spaced apart from each other. Similarly to the first embodiment, the three semiconductor chips 30[k] are positioned between the array of the three drive chips 21[k] and the array of the three connecting pads 66[k].

In a manner similar to the first embodiment, the semiconductor chip 30[k] is joined to the surface of the die pad 65 with a conductive joining material such as solder or conductive paste. Accordingly, the anode 32 of the semiconductor chip 30[k] is electrically connected to the die pad 65 (and to the connection terminal Tc_H).

The control chip 41 is joined to the surface of the first portion 651 of the die pad 65. That is, the control chip 41 is installed to overlap with the die pad 65 in plan view. An insulating adhesive is used for mounting of the control chip 41, and thereby the underside of the control chip 41 is electrically insulated from the die pad 65.

The third embodiment is the same as in the first embodiment except that the control chip 41 is joined to the die pad 65. For example, the power supply terminal Hb[k] of the control chip 41, the connecting electrode 37 of the semiconductor chip 30[k], and the connecting pad 66[k] are electrically connected with the wire Qb[k] made up of the first line Qb1 and the second line Qb2 also in the third embodiment, similarly to the first embodiment.

Effects identical to those in the first embodiment are also provided in the third embodiment. The control chip 41 is joined to the surface of the die pad 65 supplied with the control voltage Vcc in the third embodiment. That is, the die pad 63 does not need to be formed away from the die pad 65. Accordingly, the control region 57 can be more effectively reduced than in the first embodiment in which the die pad 63 is formed separately from the die pad 65. That is, both reduction in scale of the semiconductor apparatus 100 and improvement of the power density can be achieved at a high level. Furthermore, the voltage terminal Hc supplied with the control voltage Vcc in the control chip 41 can be easily connected to the die pad 65 because the control chip 41 is joined to the die pad 65.

In the third embodiment, the drive chips 21[k], the die pad 65, and the connecting pads 66[k] are arrayed in this order in the Y1 direction in plan view. Accordingly, the voltage terminal Hc of the control chip 41 joined to the die pad 65, the semiconductor chip 30[k] (the diode D[k]) joined to the die pad 65, and the connecting pads 66[k] can be effectively connected.

D: Fourth Embodiment

Figure 12:
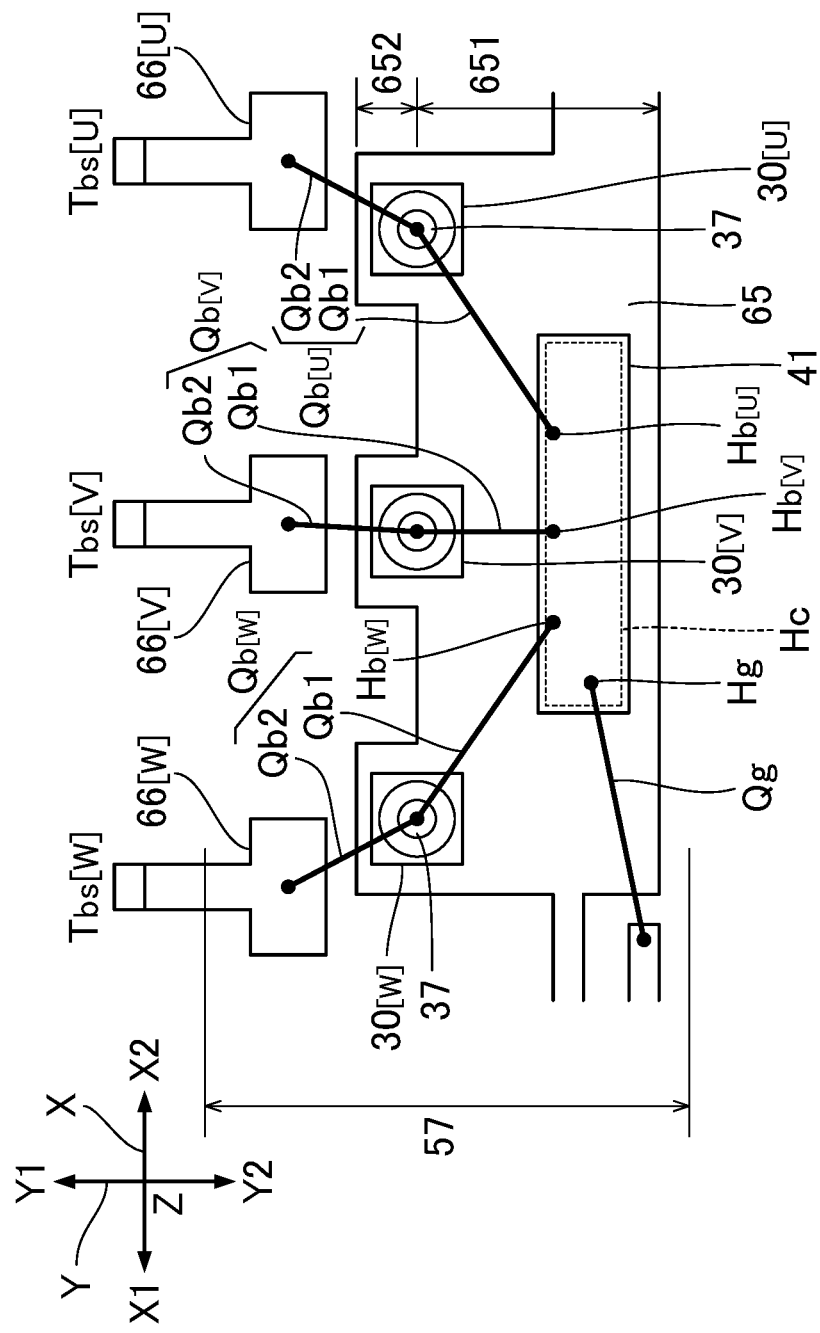
FIG. 12 is a plan view, enlarged, illustrating the vicinity of semiconductor chips according to a fourth embodiment.

FIG. 12 is a plan view, enlarged, illustrating the vicinity of the semiconductor chips 30[k] in the semiconductor apparatus 100 according to a fourth embodiment. As illustrated in FIG. 12, the control chip 41 in the fourth embodiment includes the voltage terminal Hc. The voltage terminal Hc in the fourth embodiment is a terminal formed on a surface directed to the die pad 65 (that is, the underside) of the control chip 41. The control voltage Vcc is supplied to the die pad 65 similarly to the third embodiment. The voltage terminal Hc in the fourth embodiment is an example of a "third terminal."

In the third embodiment, the control chip 41 is joined to the die pad 65 with the insulating adhesive. The control chip 41 in the fourth embodiment is joined to the die pad 65 with a conductive joining material such as solder or conductive paste, and thereby, the voltage terminal Hc on the underside of the control chip 41 is electrically connected to the die pad 65. That is, the control voltage Vcc is supplied to the voltage terminal Hc of the control chip 41 via the die pad 65. The fourth embodiment is the same as the third embodiment except that the voltage terminal Hc on the underside of the control chip 41 is joined to the die pad 65.

Effects identical to those in the third embodiment are also provided in the fourth embodiment. In the fourth embodiment, the voltage terminal Hc of the control chip 41 can be electrically connected to the die pad 65 by a simple process of joining the control chip 41 to the die pad 65 with a conductive joining material. That is, the wire Qc (FIG. 11) described above that electrically connects the voltage terminal Hc to the die pad 65 is not required. However, the wire Qc may be installed also in the fourth embodiment similarly to the third embodiment.

E: Modifications

Specific modifications added to each aspect described above are explained below. Two or more of the aspects freely selected from the embodiments described above and modifications described below may be appropriately combined with each other in a range as long as they do not conflict.

Figure 13:
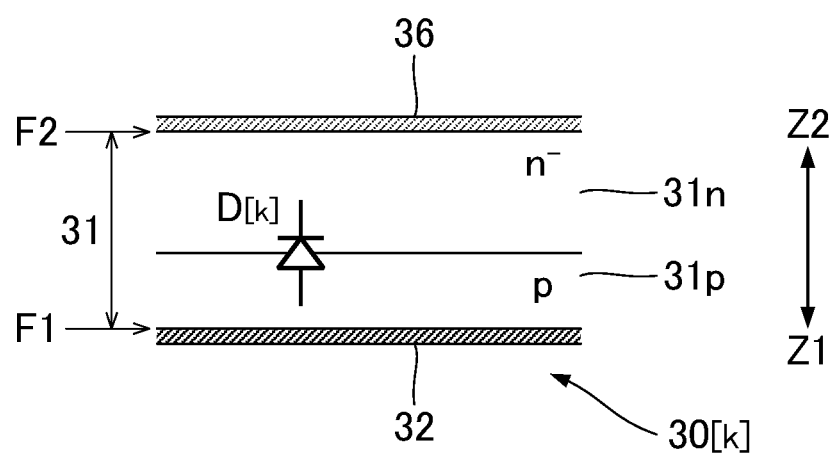
FIG. 13 is a cross-sectional view of a semiconductor chip according to a modification.

(1) In the foregoing embodiments, an example aspect has been described in which the semiconductor chip 30[k] includes the resistive element R[k]; however, the resistive element R[k] may be omitted from the semiconductor chip 30[k] as illustrated in FIG. 13. In the configuration illustrated in FIG. 13, the cathode 36 is formed on the second face F2 of the semiconductor substrate 31 to be in contact with the second face F2. The resistive element R[k] and the capacitive element B[k] are external to the semiconductor apparatus 100. The resistive element R[k] is connected to the semiconductor apparatus 100.

The anode 32 on the first face F1 is joined to the surface of the die pad 65 in a manner similar to the embodiments described above. The cathode 36 on the second face F2 is electrically connected to the power supply terminal Hb[k] of the control chip 41 via the first line Qb1 of the wire Qb[k], and is electrically connected to the connecting pad 66[k] via the second line Qb2 of the wire Qb[k].

As is clear from the above, in one aspect of the present disclosure, the cathode 36 of the diode D[k] is electrically connected to the power supply terminal Hb[k]. It is not limited whether the cathode 36 is indirectly connected to the power supply terminal Hb[k] via the resistive element R[k] (FIG. 3) or the cathode 36 is directly connected to the power supply terminal Hb[k] (FIG. 13) in the present disclosure.

(2) In the foregoing embodiments, an example aspect has been described in which the casing 50 includes the resin case 51, the support plate 52, and the sealing resin 53. However, the configuration of the casing 50 is not limited to such an example. For example, a full mold casing 50, with which the resin case 51 and the sealing resin 53 are integrated, may be adopted. In the full mold casing 50, the insulating layer 521 may be integrated in addition to the resin case 51 and the support plate 52. In the full mold casing 50, the resin case 51 and the sealing resin 53 (and the insulating layer 521) are collectively formed of a resin material such as epoxy resin, or other kinds of resin materials. The sealing resin 53 in the embodiment described above and the full mold casing 50 in the present modification may contain an insulating filler such as a silicon oxide filler, an aluminum oxide filler, or other kinds of insulating fillers, in addition to the resin material. The heatsink 522 may be omitted from the casings 50 illustrated in the embodiments described above and the present modification.

(3) In the foregoing embodiments, an example aspect has been described in which the coupling portion between the first line Qb1 and the second line Qb2 is a stitch. However, the first line Qb1 and the second line Qb2 may be separate lines.

(4) In the foregoing embodiments, an example configuration has been described in which the semiconductor substrate 31 of the semiconductor chip 30[k] is a p-type semiconductor substrate. However, the conductivity type of the semiconductor substrates 31 is not limited to such an example. For example, an n-type semiconductor substrate may be adopted as the semiconductor substrate 31, and the p-type semiconductor region 31p may be formed on the first face F1. As is clear from the above explanations, the semiconductor substrate 31 itself can have any conductivity type as long as a PN junction of the diode D[k] is formed by the p-type semiconductor region 31p on the first face F1 and the n-type semiconductor region 31n on the second face F2.

(5) In the foregoing embodiments, an example has been described in which the RC-IGBT including an IGBT and an FWD is the drive chips 21[k] and 22[k]. However, the drive chip 21[k] or 22[k] may be made up of a chip of an IGBT and a chip of an FWD. The IGBT may be replaced with other transistors such as a MOSFET (Metal-Oxide-Semiconductor Field-Effect Transistor). In an aspect of adaption of the MOSFET, the main electrode C is one of the source electrode and the drain electrode, and the main electrode E is the other of the source electrode and the drain electrode.

E. Appendices

For example, the following configurations are presented based on the various modes exemplified above.

A semiconductor apparatus according to one aspect (a first aspect) of the present disclosure includes: a power semiconductor element; a control chip including a plurality of terminals including a first terminal and a second terminal, and being configured to control the power semiconductor element using a power supply voltage supplied to the second terminal; a first conductor for supplying a predetermined control voltage to the first terminal; a first line for supplying the power supply voltage to the second terminal; and a semiconductor chip including a diode to be used for a bootstrap operation for generating the power supply voltage, in which the semiconductor chip includes: a semiconductor substrate including a first face and a second face that are opposed to each other, and having a PN junction of the diode formed by a p-type semiconductor region on the first face and an n-type semiconductor region on the second face; an anode formed on the first face and joined to a surface of the first conductor; and a cathode formed on the second face and electrically connected to the second terminal via the first line.

In this aspect, the anode of the diode is formed on the first face of the semiconductor substrate, and the anode of the diode is joined to the first conductor for supplying the control voltage to the first terminal of the control chip. That is, the diode is installed to direct the anode to the first conductor. The cathode formed on the second face of the semiconductor substrate is electrically connected to the second terminal of the control chip via a line such as a wire.

According to this configuration, the region required to install elements (the control chip, the first conductor, and the diode) for control of the power semiconductor element is reduced as compared to a configuration in which the anode formed on the second face of the semiconductor substrate is connected to the first conductor with a wire. With this reduction of the region, reduction in scale of the semiconductor apparatus and improvement of the power density by increase in scale of the power semiconductor element can be both achieved.

The "bootstrap operation" is an operation for generating the power supply voltage of the control chip by charging the capacitive element (a bootstrap capacitor) using a charging path from the first conductor through the diode. That is, the power supply voltage is generated by the bootstrap operation using the control voltage. For example, a power supply voltage higher by the control voltage than the potential of the main electrode (for example, an emitter) of the power semiconductor element can be generated by the bootstrap operation.

The description "the anode is formed on the first face" means that a part or the entirety of the anode overlaps the first face in plan view (that is, the anode is formed above the first face). Therefore, a configuration in which the anode is formed directly on the first face so that the anode is in contact with the first face, and also a configuration in which other elements are interposed between the anode and the first face satisfy the requirement that "the anode is formed on the first face."

The same applies to the relation between the cathode and the second face. That is, the description "the cathode is formed on the second face" means that a part or the whole of the cathode overlaps the second face (that is, the cathode is formed above the second face) in plan view. Therefore, a configuration in which the cathode is formed directly on the second face so that the cathode is in contact with the second face, and also a configuration in which other elements are interposed between the cathode and the second face satisfy the requirement that "the cathode is formed on the second face."

A situation in which an element A is "electrically connected" to an element B includes a configuration in which the element A is directly connected to the element B, and additionally includes a configuration in which other conductive bodies are interposed between the element A and the element B. For example, the configuration in which the cathode of the diode is electrically connected to the second terminal includes a configuration in which the cathode of the diode is connected directly to the second terminal, and additionally includes a configuration in which the cathode of the diode is connected indirectly to the second terminal with other conductive bodies (for example, a resistive element) interposed therebetween.

A specific example (a second aspect) of the first aspect further includes: a second conductor that is connectable to a capacitive element external to the semiconductor apparatus and that is used for the bootstrap operation; and a second line electrically connecting the cathode to the second conductor.

In this aspect, the second terminal of the control chip is electrically connected to the second conductor via the first line, the cathode of the diode, and the second line. Therefore, the capacitive element of a desired capacitance externally connected to the semiconductor apparatus can be used for the bootstrap operation.

In a specific example (a third aspect) of the second aspect, a coupling portion between the first line and the second line is a stitch on the second face.

In this aspect, the second conductor for external connection, the cathode of the diode, and the second terminal of the control chip are mutually electrically connected by stitch bonding. Therefore, a process of electrically connecting the second conductor, the cathode, and the second terminal is simplified as compared to a configuration in which the first line and the second line are separately installed.

A specific example (a fourth aspect) of the second aspect or the third aspect further includes a third conductor supplied with a ground voltage, and the control chip is joined to a surface of the third conductor.

In this aspect, the control chip is joined to a surface of the third conductor supplied with the ground voltage. That is, the control chip is installed to overlap with the third conductor in plan view. Therefore, a terminal supplied with the ground voltage among the terminals of the control chip can be easily connected to the third conductor.

In a specific example (a fifth aspect) of the fourth aspect, the control chip further includes a ground terminal formed on a face directed to the third conductor, and the control chip is joined to the third conductor with a conductive joining material.

According to this aspect, the ground terminal of the control chip and the third conductor can be electrically connected to each other by a simple process of joining the control chip to the third conductor with the conductive joining material.

In a specific example (a sixth aspect) of the fourth aspect or the fifth aspect, the third conductor is positioned between the power semiconductor element and the first conductor in plan view, and the first conductor is positioned between the third conductor and the second conductor in plan view.

According to this aspect, the power semiconductor element, the third conductor, the first conductor, and the second conductor are arrayed in the order described above in plan view. Therefore, the semiconductor chip that is joined to the second terminal of the control chip joined to the third conductor and that is joined to the first conductor can be effectively connected to the second conductor.

In a specific example (a seventh aspect) of the second aspect or the third aspect, the control chip is joined to a surface of the first conductor.

In this aspect, the control chip is joined to a surface of the first conductor. That is, the control chip is installed to overlap with the first conductor in plan view. Therefore, a region required to install elements (the control chip, the first conductor, and the diode) for control of the power semiconductor element can be more effectively reduced as compared to a configuration in which the control chip does not overlap with the first conductor in plan view.

In a specific example (an eighth aspect) of the seventh aspect, the control chip further includes a third terminal formed on a face directed to the first conductor, and the control chip is joined to the first conductor with a conductive joining material.

According to this aspect, the third terminal of the control chip can be electrically connected to the first conductor by a simple process of joining the control chip to the first conductor with the conductive joining material.

In a specific example (a ninth aspect) of the seventh aspect or the eighth aspect, the first conductor is positioned between the power semiconductor element and the second conductor in plan view.

According to this aspect, the power semiconductor element, the first conductor, and the second conductor are arrayed, in the order described above, in plan view. Therefore, the second terminal of the control chip joined to the first conductor, the semiconductor chip joined to the first conductor, and the second conductor can be effectively connected.

In a specific example (a tenth aspect) of any one of the first to ninth aspects, the first conductor includes a first portion, and a second portion protruding from a peripheral edge of the first portion in plan view, and at least a part of the semiconductor chip overlaps the second portion in plan view.

In this aspect, a sufficient region to install the semiconductor chip can be allocated by the second portion of the first conductor protruding from the peripheral edge of the first portion in plan view.

In a specific example (an eleventh aspect) of any one of the first to tenth aspects, the semiconductor chip further includes a current-limiting resistive element electrically connected to the cathode.

According to this aspect, a current flowing in the diode in the bootstrap operation can be limited by the current-limiting resistive element.

In a specific example (a twelfth aspect) of the eleventh aspect, the semiconductor chip further includes: an insulating layer formed on the second face; and a resistive layer formed on the insulating layer, in which the resistive element is made up of the resistive layer.

According to this aspect, the current-limiting resistive element can be easily formed by stacking of the insulating layer and the resistive layer on the second face.

A semiconductor chip according to another aspect (a thirteenth aspect) of the present disclosure is a semiconductor chip including: a diode being used for a bootstrap operation for generating a power supply voltage, and being electrically connected between a first terminal and a second terminal among a plurality of terminals of a control chip controlling a power semiconductor element, where the first terminal is electrically connected to a first conductor supplied with a predetermined control voltage, and the second terminal is supplied with the power supply voltage; a semiconductor substrate: including a first face and a second face that are opposed to each other; and having a PN junction of the diode formed by a p-type semiconductor region on the first face and an n-type semiconductor region on the second face; an anode formed on the first face and joined to a surface of the first conductor; and a cathode formed on the second face and electrically connected to the second terminal via a first line.

In a specific example (a fourteenth aspect) of the thirteenth aspect, the anode contains a metallic film made of nickel or nickel alloy, and the cathode contains a metallic film made of aluminum or aluminum alloy.

According to this aspect, the anode can be satisfactorily joined to a conductive joining material such as solder or conductive paste. Furthermore, for example, a wire can be satisfactorily joined to the cathode.

A specific example (a fifteenth aspect) of the thirteenth aspect or the fourteenth aspect further includes a current-limiting resistive element electrically connected to the cathode.

According to this aspect, a current flowing in the diode in the bootstrap operation can be limited by the current-limiting resistive element.

When the semiconductor chip to be used for the bootstrap operation described above is to be mounted, a mode in which one of the anode and the cathode is joined to the conductive joining material by, for example, solder or conductive paste, and a wire is joined to the other of the anode and the cathode is assumed. The joining property of the anode or the cathode to the conductive joining material and the wire is a problem in the above mode.

In view of solving the above problem, a semiconductor chip according to still another aspect (a sixteenth aspect) of the present disclosure is a semiconductor chip including: a diode that is used for a bootstrap operation for generating a power supply voltage of a control chip controlling a power semiconductor element, a semiconductor substrate including a first face and a second face that are opposed to each other, and having a PN junction of the diode formed by a p-type semiconductor region on the first face and an n-type semiconductor region on the second face; an anode containing a metallic film made of nickel or nickel alloy on the first face; a cathode containing a metallic film made of aluminum or aluminum alloy on the second face; and a current-limiting resistive element electrically connected to the cathode.

According to this aspect, the anode can be satisfactorily joined to the conductive joining material such as solder or conductive paste. Furthermore, the wire can be satisfactorily joined to the cathode.

A specific example (a seventeenth aspect) of the fifteenth aspect or the sixteenth aspect further includes: an insulating layer formed on the second face; and a resistive layer formed on the insulating layer, in which the resistive element is made up of the resistive layer.

According to this aspect, a current-limiting resistive element can be easily formed by stacking the insulating layer and the resistive layer on the second face.

DESCRIPTION OF REFERENCE SIGNS

100 . . . semiconductor apparatus, 102 . . . control device, 103, 104 . . . external power source, 21[k] (21[U], 21[V], 21[W]) . . . drive chip, 22[k] (22[U], 22[V], 22[W]) . . . drive chip, 30[k] (30[U], 30[V], 30[W]) . . . drive chip, 31 . . . semiconductor substrate, 31n . . . n-type semiconductor region, 31p . . . p-type semiconductor region, F1 . . . first face, F2 . . . second face, 32 . . . anode, 33 . . . first insulating layer, 34 . . . resistive layer, 35 . . . second insulating layer, 36 . . . cathode, 37 . . . connecting electrode, 38 . . . protective layer, 381 . . . coating portion, 382 . . . partition portion, 383 . . . opening, 41 . . . control chip, 42 . . . control chip, 50 . . . casing, 51 . . . resin case, 52 . . . support plate, 521 . . . insulating layer, 522 . . . heatsink, 53 . . . sealing resin, 55 . . . element region, 56 . . . terminal region, 57 . . . control region, 60 . . . lead frame, 61 to 65 . . . die pad, 66[k] (66[U], 66[V], 66[W]) . . . connecting pad, 651 . . . first portion, 652[k] (652[U], 652[V], 652[W]) . . . second portion, D[k] (D[U], D[V], D[W]) . . . diode, R[k] (R[U], R[V], R[W]) . . . resistive element, B[k] (B[U], B[V], B[W]) . . . capacitive element, H (Hin[k], Hout[k], Hb[k], Hs[k], Hc, Hg) . . . terminal, L (Lin[k], Lout[k], Lc, Lg) . . . terminal, Lc . . . voltage terminal, Qb, Qc, Qg . . . wire, Qb1 . . . first line, Qb2 . . . second line, R[k] (R[U], R[V], R[W]) . . . resistive element, T (Tin_H[k], Tin_L[k], Tout[k], Tc_H, Tc_L, Tg, Tp, Tn[k], Tbs[k]) . . . connection terminal, α . . . charging path.

What is claimed is:
1. A semiconductor apparatus comprising:
a power semiconductor element;
a control chip:
including a plurality of terminals including a first terminal and a second terminal; and
being configured to control the power semiconductor element using a power supply voltage supplied to the second terminal;
a first conductor for supplying a predetermined control voltage to the first terminal;
a first line for supplying the power supply voltage to the second terminal; and
a semiconductor chip including a diode that is used for a bootstrap operation for generating the power supply voltage,
wherein
the semiconductor chip includes:
a semiconductor substrate:
including a first face and a second face that are opposed to each other, and
having a PN junction of the diode formed by a p-type semiconductor region on the first face and an n-type semiconductor region on the second face;
a resistive element;
an anode of the diode formed on the first face and joined directly to a surface of the first conductor, the anode of the diode being electrically connected to the first terminal; and
a cathode of the diode formed on the second face and electrically connected to the second terminal via the resistive element and the first line, the cathode of the diode being electrically connected one end of the resistive element, wherein the other end of the resistive element being electrically connected to the second terminal.
2. The semiconductor apparatus according to claim 1, further comprising:
a second conductor that is connectable to a capacitive element external to the semiconductor apparatus and that is used for the bootstrap operation; and
a second line electrically connecting the cathode to the second conductor.

3. The semiconductor apparatus according to claim 2, wherein a coupling portion between the first line and the second line is a stitch on the second face.

4. The semiconductor apparatus according to claim 2, further comprising a third conductor supplied with a ground voltage,
wherein the control chip is joined to a surface of the third conductor.

5. The semiconductor apparatus according to claim 4, wherein:
the control chip further includes a ground terminal formed on a face directed to the third conductor, and
the control chip is joined to the third conductor with a conductive joining material.

6. The semiconductor apparatus according to claim 4, wherein:
the third conductor is positioned between the power semiconductor element and the first conductor in plan view, and
the first conductor is positioned between the third conductor and the second conductor in plan view.

7. The semiconductor apparatus according to claim 2, wherein the control chip is joined to a surface of the first conductor.

8. The semiconductor apparatus according to claim 7, wherein:
the control chip further includes a third terminal formed on a face directed to the first conductor, and
the control chip is joined to the first conductor with a conductive joining material.

9. The semiconductor apparatus according to claim 7, wherein the first conductor is positioned between the power semiconductor element and the second conductor in plan view.

10. The semiconductor apparatus according to claim 1, wherein:
the first conductor includes:
  a first portion; and
  a second portion protruding from a peripheral edge of the first portion in plan view, and
at least a part of the semiconductor chip overlaps the second portion in plan view.

11. The semiconductor apparatus according to claim 1, wherein the resistive element includes a current-limiting resistive element electrically connected to the cathode.

12. The semiconductor apparatus according to claim 11, wherein:
the semiconductor chip further includes:
  an insulating layer formed on the second face; and
  a resistive layer formed on the insulating layer, and
the resistive element is made up of the resistive layer.

13. A semiconductor chip comprising:
a diode:
  being used for a bootstrap operation for generating a power supply voltage; and
  being electrically connected between a first terminal and a second terminal among a plurality of terminals of a control chip controlling a power semiconductor element, where the first terminal is electrically connected to a first conductor supplied with a predetermined control voltage, and the second terminal is supplied with the power supply voltage;
a semiconductor substrate:
  including a first face and a second face that are opposed to each other; and
  having a PN junction of the diode formed by a p-type semiconductor region on the first face and an n-type semiconductor region on the second face;
a resistive element;
an anode of the diode formed on the first face and joined directly to a surface of the first conductor, the anode of the diode being electrically connected to the first terminal; and
a cathode of the diode formed on the second face and electrically connected to the second terminal via the resistive element and a first line, the cathode of the diode being electrically connected one end of the resistive element, wherein the other end of the resistive element being electrically connected to the second terminal.

14. The semiconductor chip according to claim 13, wherein:
the anode contains a metallic film made of nickel or nickel alloy, and
the cathode contains a metallic film made of aluminum or aluminum alloy.

15. The semiconductor chip according to claim 13, wherein the resistive element further comprising a current-limiting resistive element electrically connected to the cathode.

16. The semiconductor chip according to claim 15, further comprising:
an insulating layer formed on the second face; and
a resistive layer formed on the insulating layer,
wherein the resistive element is made up of the resistive layer.

17. A semiconductor chip comprising:
a diode that is used for a bootstrap operation for generating a power supply voltage of a control chip controlling a power semiconductor element;
a semiconductor substrate:
  including a first face and a second face that are opposed to each other, and
  having a PN junction of the diode formed by a p-type semiconductor region on the first face and an n-type semiconductor region on the second face,
an anode of the diode containing a metallic film made of nickel or nickel alloy on the first face; and
a cathode of the diode containing a metallic film made of aluminum or aluminum alloy directly on the second face; and
a current-limiting resistive element electrically connected to the cathode and to a power supply terminal of the control chip to supply the power supply voltage to the control chip, wherein one end of the current-limiting resistive element is electrically connected to the cathode and the other end of the current-limiting resistive element is electrically connected to the power supply terminal.

18. The semiconductor chip according to claim 17, further comprising:
an insulating layer formed on the second face; and
a resistive layer formed on the insulating layer,
wherein the resistive element is made up of the resistive layer.

* * * * *